United States Patent
Lee et al.

(10) Patent No.: US 10,644,205 B2
(45) Date of Patent: May 5, 2020

(54) LIGHT-EMITTING DIODE PACKAGE AND METHOD OF MANUFACTURING THE SAME

(71) Applicant: SAMSUNG ELECTRONICS CO., LTD., Suwon-si (KR)

(72) Inventors: Dong-kuk Lee, Hwaseong-si (KR); Moon-sub Kim, Suwon-si (KR); Sung-jin Ahn, Hwaseong-si (KR); Suk-ho Yoon, Seoul (KR); Seung-hwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/129,021

(22) Filed: Sep. 12, 2018

(65) Prior Publication Data
US 2019/0280162 A1  Sep. 12, 2019

(30) Foreign Application Priority Data
Mar. 9, 2018  (KR) .................... 10-2018-0028310

(51) Int. Cl.
| | | |
|---|---|---|
| H01L 33/50 | (2010.01) | |
| H01L 33/12 | (2010.01) | |
| H01L 33/26 | (2010.01) | |
| G02F 1/1335 | (2006.01) | |
| G02F 1/13357 | (2006.01) | |

(52) U.S. Cl.
CPC .............. *H01L 33/50* (2013.01); *H01L 33/12* (2013.01); *H01L 33/26* (2013.01); *G02F 1/133514* (2013.01); *G02F 1/133603* (2013.01)

(58) Field of Classification Search
CPC ......... H01L 51/56; H01L 33/60; H01L 33/62; H01L 33/56; C09K 11/06
USPC ........................................................... 257/99
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| JP | 2012-227470 A | 11/2012 |
| JP | 2013-84606 A | 5/2013 |

(Continued)

*Primary Examiner* — Andy Huynh
(74) *Attorney, Agent, or Firm* — Sughrue Mion, PLLC

(57) ABSTRACT

A light-emitting diode (LED) package includes: an LED having a polygonal shape in a plan view; a light-transmissive layer directing light from the LED in an upward direction; a wavelength conversion layer changing a wavelength of the light emitted through the light-transmissive layer; and a coating layer covering the light-transmissive layer and reflecting the light emitted through the light-transmissive layer in the upward direction. In a plan view of the light-transmissive layer, a length from a first point corresponding to a vertex of the LED to a second point corresponding to an end of an extension of a diagonal of the LED is greater than or equal to a length from the first point to a third point corresponding to an end of an extension of a side of the LED.

20 Claims, 28 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,055,203 B2 | 11/2011 | Choueirt et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,921,877 B2 | 12/2014 | Ito et al. |
| 9,276,180 B2 | 3/2016 | Ishida et al. |
| 9,349,664 B2 | 5/2016 | Ishida et al. |
| 9,577,161 B2 | 2/2017 | Sato et al. |
| 9,614,135 B2 | 4/2017 | Sato |
| 2016/0093777 A1 | 3/2016 | Sato et al. |
| 2016/0240746 A1 | 8/2016 | Yun et al. |
| 2016/0293810 A1 | 10/2016 | Baike et al. |
| 2016/0351765 A1 | 12/2016 | Suzuki |
| 2016/0351766 A1 | 12/2016 | Hayashi et al. |

FOREIGN PATENT DOCUMENTS

| | | |
|---|---|---|
| JP | 2016-86111 A | 5/2016 |
| JP | 6065135 B2 | 1/2017 |

B-B

C-C

B-B

C-C

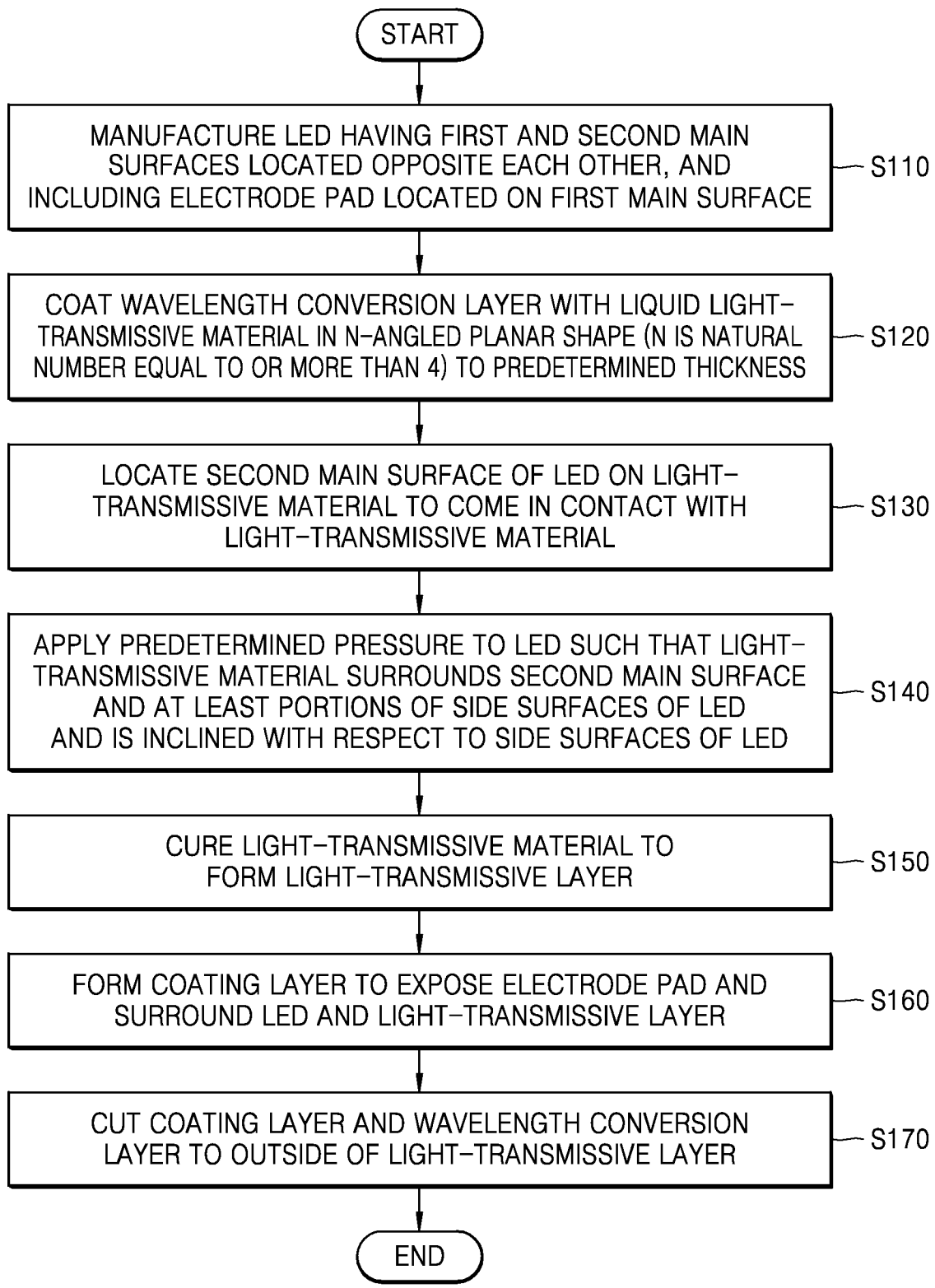

B-B

LIGHT-EMITTING DIODE PACKAGE AND METHOD OF MANUFACTURING THE SAME

CROSS-REFERENCE TO THE RELATED APPLICATION

This application claims priority from Korean Patent Application No. 10-2018-0028310, filed on Mar. 9, 2018, in the Korean Intellectual Property Office, the disclosure of which is incorporated herein in its entirety by reference.

BACKGROUND

Apparatuses and methods consistent with example embodiments of the inventive concept relate to a light-emitting diode (LED) package having improved light extraction efficiency.

An LED package may include a light-transmissive layer and a coating layer, which are located in the vicinity of an LED to improve extraction efficiency of light emitted by the LED. In recent years, with a reduction in the size of LEDs, an LED package including a stable light-transmissive layer and coating layer capable of effectively increasing light extraction efficiency is required.

SUMMARY

Example embodiments of the inventive concept provide a chip-scale light-emitting diode (LED) package including a light-transmissive layer and a coating layer, which may effectively increase light extraction efficiency, and a method of manufacturing the same.

Various aspects of the inventive concept should not be limited by the example embodiments described herein, and other unmentioned aspects will be clearly understood by one of ordinary skill in the art from these embodiments.

According to an example embodiment, there is provided an LED package which may include: an LED having an upper surface, a lower surface, and side surfaces connecting the upper surface and the lower surface, and configured to generate and emit light, the LED having a polygonal shape in a plan view of the LED package; a light-transmissive layer covering the upper surface and at least some portions of the side surfaces of the LED, and configured to direct the light emitted from the LED in an upward direction; a wavelength conversion layer disposed on the light-transmissive layer, and configured to change a wavelength of the light emitted through the light-transmissive layer; and a coating layer covering side surfaces of the light-transmissive layer, and configured to reflect the light emitted through the light-transmissive layer in the upward direction at an interface with the light-transmissive layer. Here, in a sectional view of the LED package, the side surfaces of the light-transmissive layer may be inclined with respect to the side surfaces of the LED, and, in the plan view of the LED package, a length from a first point of the light-transmissive layer corresponding to a vertex of the LED to a second point of the light-transmissive layer corresponding to an end of an extension of a diagonal of the LED may be greater than or equal to a length from the first point to a third point of the light-transmissive layer corresponding to an end of an extension of a side of the LED.

According to an example embodiment, there is provided an LED package which may include: an LED having an upper surface, a lower surface, and side surfaces connecting the upper surface and the lower surface, and configured to generate and emit light; a light-transmissive layer covering the upper surface and the side surfaces of the LED, and configured to direct the light emitted from the LED in an upward direction; a wavelength conversion layer disposed on the light-transmissive layer, and configured to change a wavelength of the light emitted through the light-transmissive layer; and a coating layer covering the side surfaces of the light-transmissive layer, and configured to reflect the light emitted through the light-transmissive layer in the upward direction at an interface with the light-transmissive layer. Here, in a plan view of the LED package, the LED may have a polygonal shape and the light-transmissive layer may have a corresponding polygonal shape, and, in a sectional view of the LED package, the side surfaces of the light-transmissive layer may be inclined with respect to the side surfaces of the LED, and an angle formed by an edge connecting two adjacent side surfaces of the light-transmissive layer and a corresponding edge of the LED may be greater than or equal to an angle formed by a side surface of the light-transmissive layer and a corresponding side surface of the LED.

According to an example embodiment, there is provided an LED package which may include: an LED having an upper surface, a lower surface, and side surfaces connecting the upper surface and the lower surface, and configured to generate and emit light; a light-transmissive layer covering the upper surface and the side surfaces of the LED; a wavelength conversion layer disposed on the light-transmissive layer, and configured to change a wavelength of the light emitted through the light-transmissive layer; and a coating layer covering the side surfaces of the light-transmissive layer, and configured to reflect the light emitted through the light-transmissive layer in the upward direction. In a plan view of the LED package, the LED may have a polygonal shape and the light-transmissive layer has a corresponding polygonal shape, and a length from a first point of the light-transmissive layer corresponding to a vertex of the LED to a second point of the light-transmissive layer corresponding to an end of an extension of a diagonal of the LED may be greater than or equal to a length from the first point to a third point of the light-transmissive layer corresponding to an end of an extension of a side of the LED, and, in a sectional view of the LED package, the side surfaces of the light-transmissive layer may be inclined with respect to the side surfaces of the LED, and an angle formed by an edge connecting two adjacent side surfaces of the light-transmissive layer and a corresponding edge of the LED may be greater than or equal to an angle formed by a side surface of the light-transmissive layer and a corresponding side surface of the LED.

BRIEF DESCRIPTION OF THE DRAWINGS

Example embodiments of the inventive concept will be more clearly understood from the following detailed description taken in conjunction with the accompanying drawings, in which:

FIG. 5 is a process flowchart of a method of manufacturing an LED package, according to an example embodiment;

DETAILED DESCRIPTION OF THE EXEMPLARY EMBODIMENTS

Figure 1A:
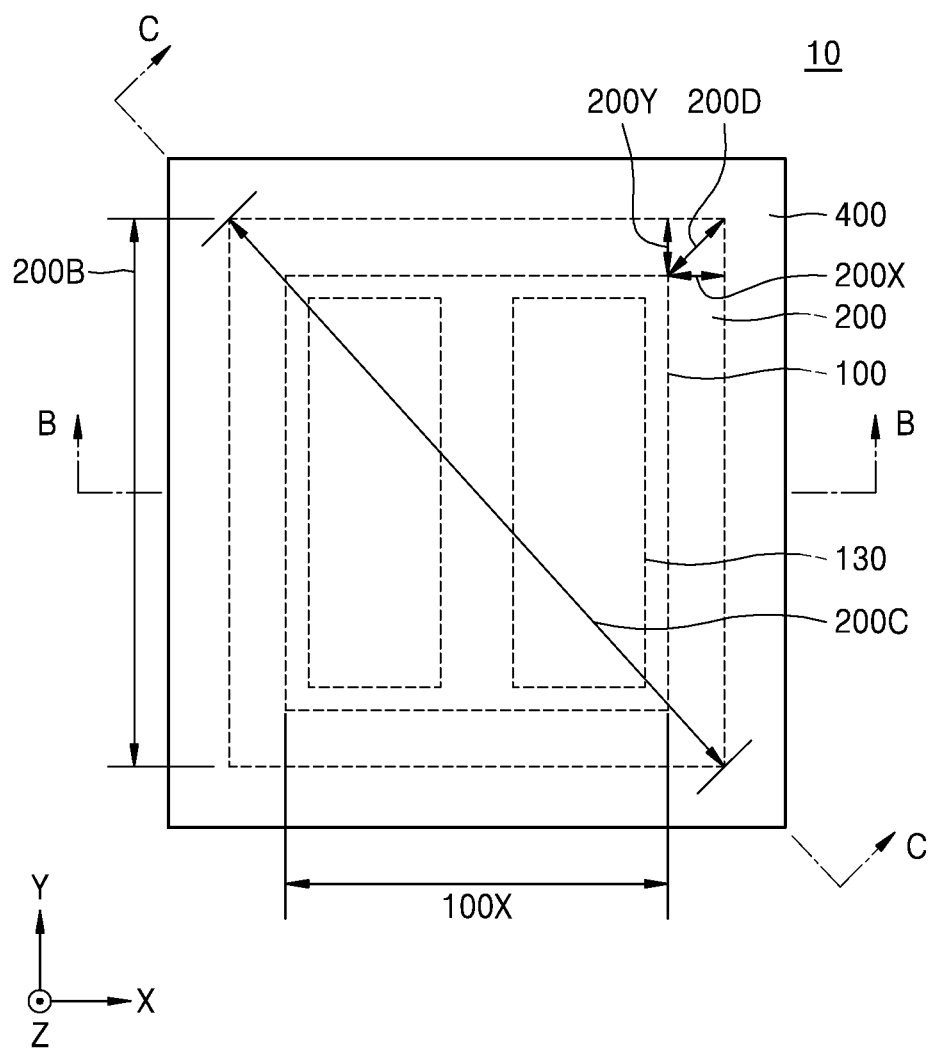
FIGS. 1A to 1G are diagrams of a light-emitting diode (LED) package including a plan view and sectional views, according to an example embodiment.

Various example embodiments of the inventive concepts will be described more fully hereinafter with reference to the accompanying drawings. The inventive concepts may, however, be embodied in many different forms and should not be construed as limited to the embodiments set forth herein. Rather, these embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer (e.g., a first conductive type semiconductor layer) or section discussed below could be termed a second element, component, region, layer (e.g., a second conductive type semiconductor layer) or section, and vice versa, without departing from the inventive concept.

Figure 1B:
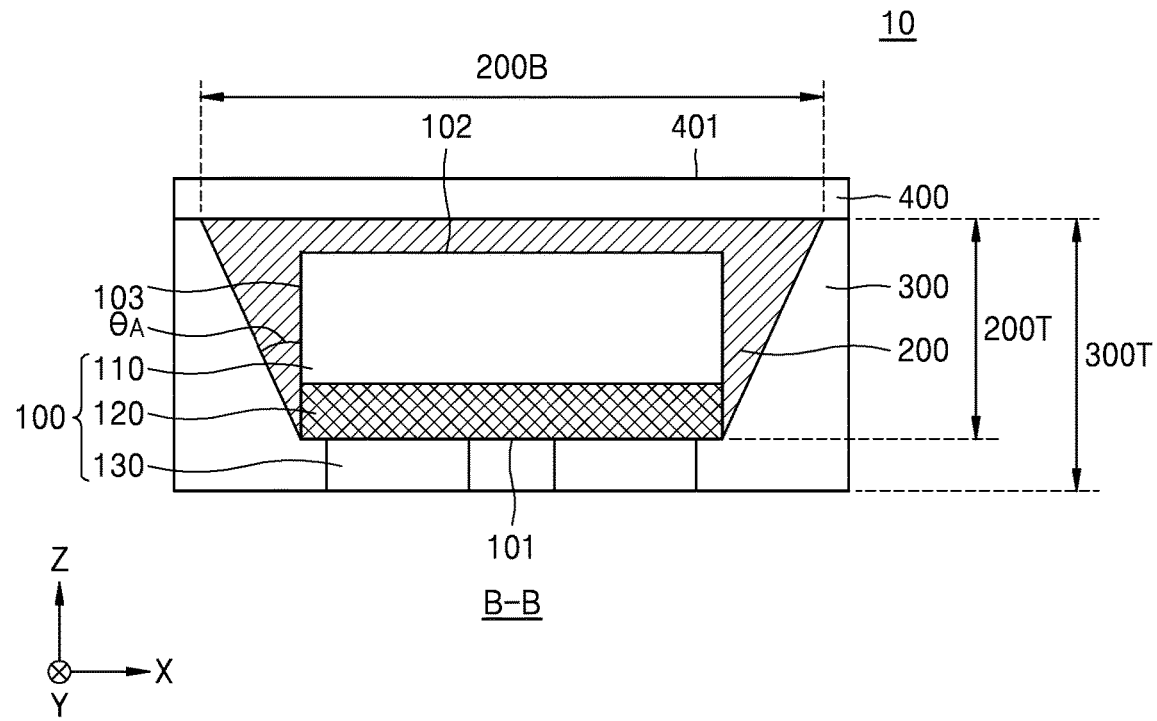
Figure 1C:
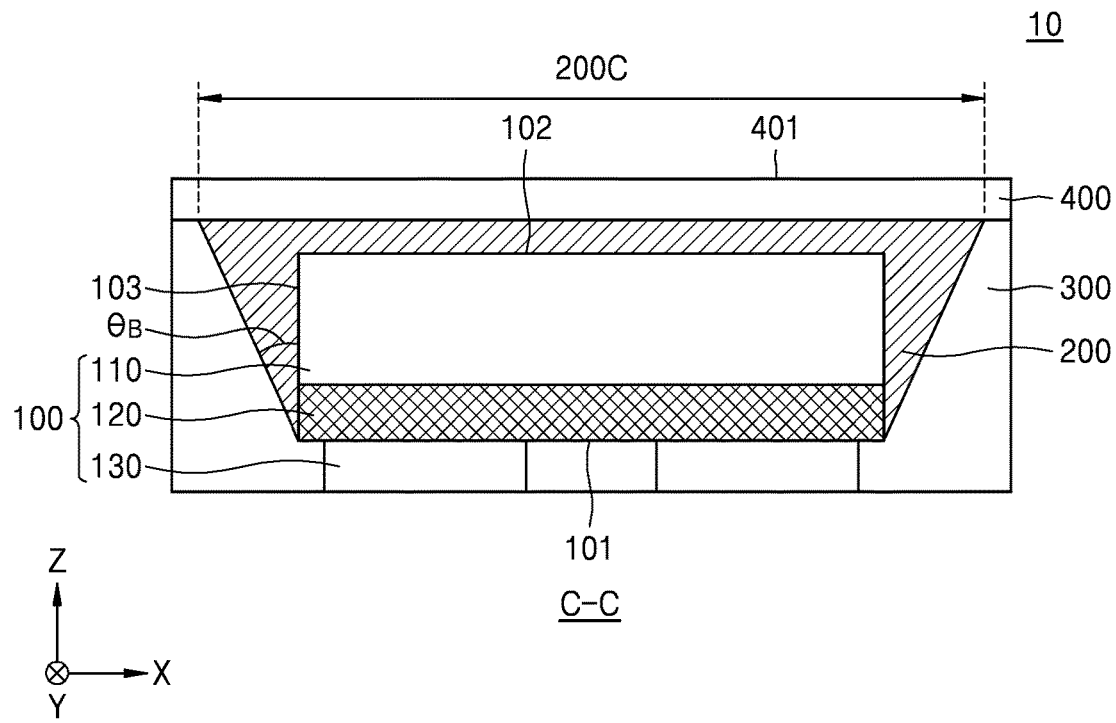
Figure 1D:
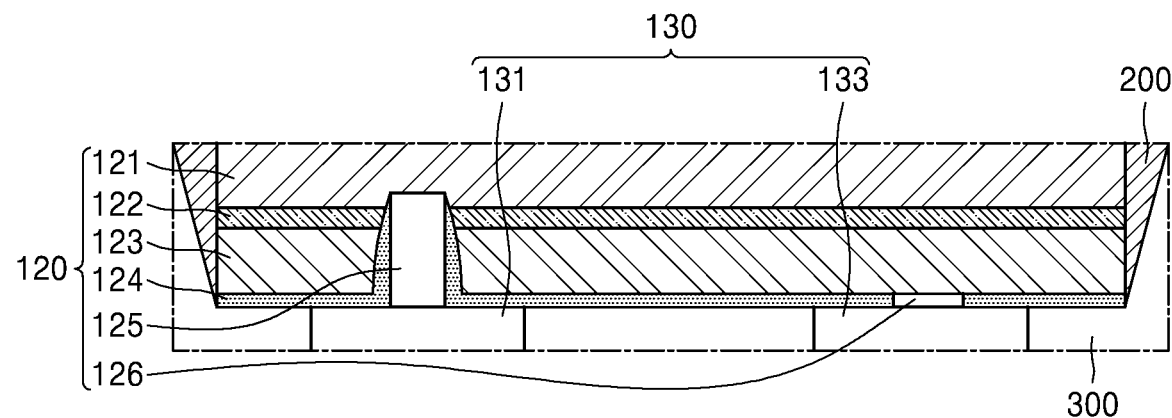
Figure 1E:
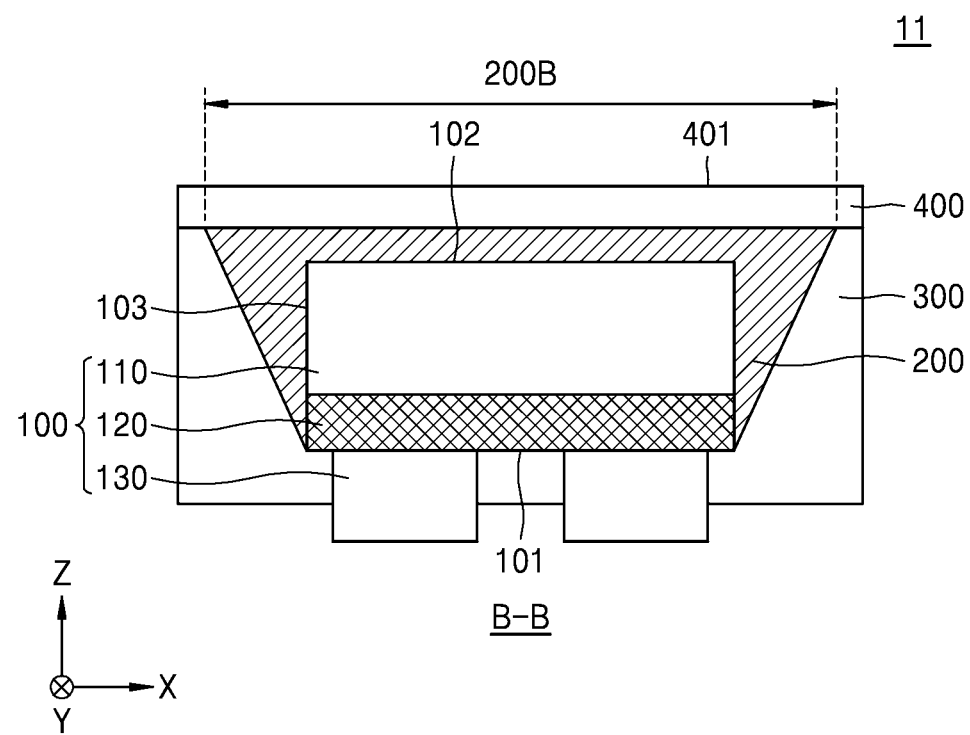
Figure 1F:
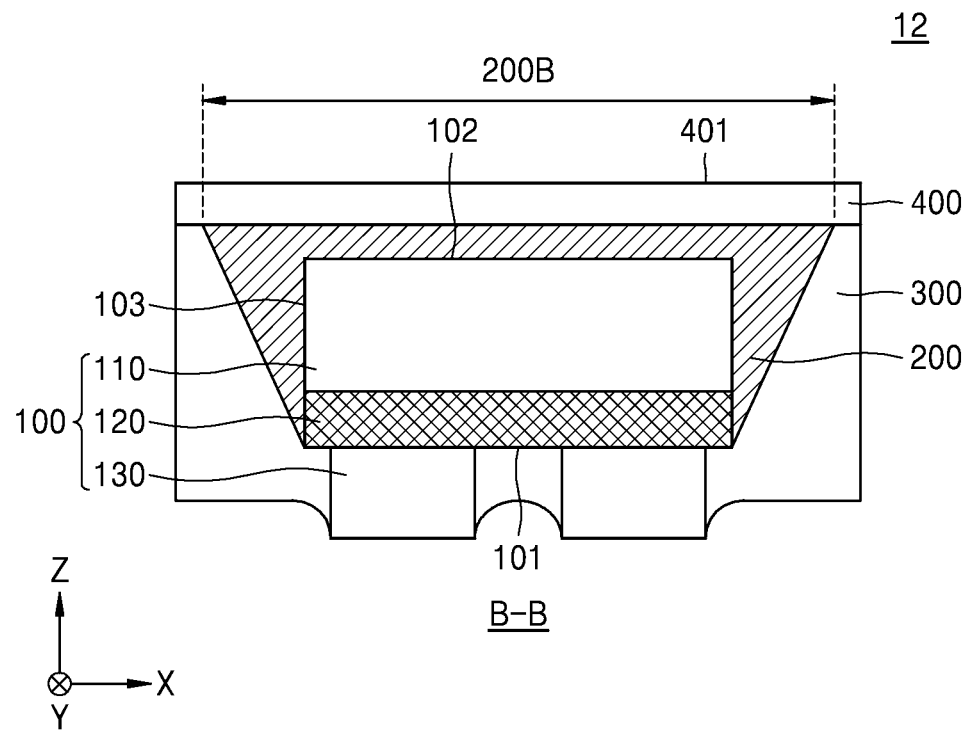
Figure 1G:
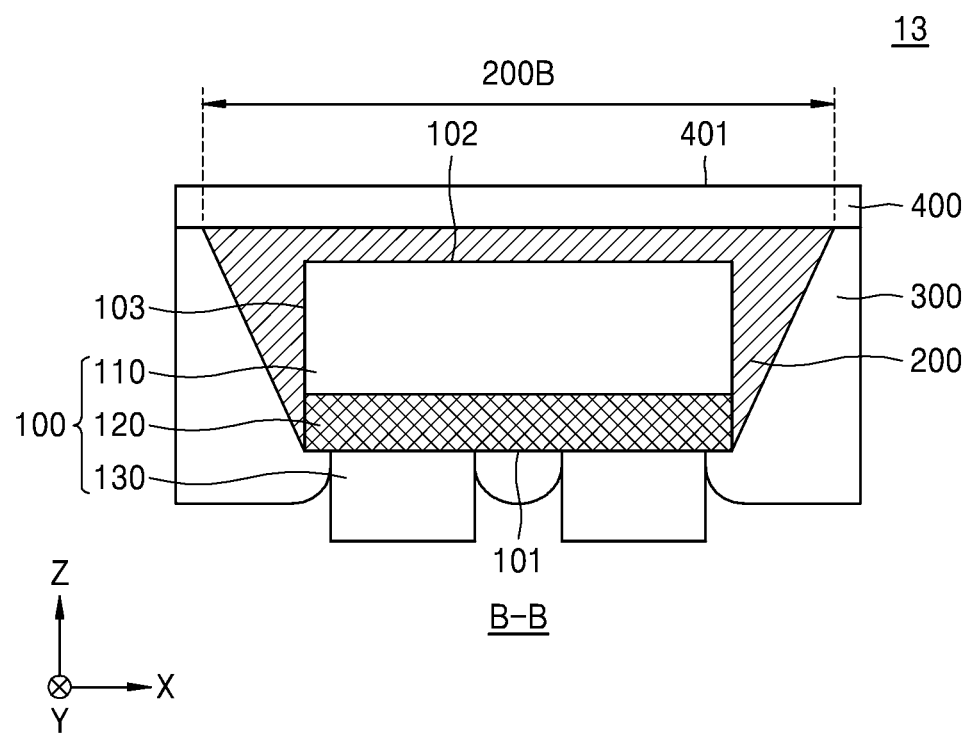

FIG. 1A is a plan view of a light-emitting diode (LED) package 10 according to an embodiment. FIG. 1B is a cross-sectional view of a portion corresponding to a cross-section taken along a line B-B of FIG. 1A. FIG. 1C is a cross-sectional view of a portion corresponding to a cross-section taken along a line C-C of FIG. 1A. FIG. 1D is an enlarged view of a light-emitting structure of FIG. 1B and a peripheral portion thereof. Also, FIGS. 1E to 1G are cross-sectional views of LED packages according to other embodiments, which have some differences from the LED package 10 of FIG. 1B.

Referring to FIGS. 1A to 1D, the LED package 10 may include an LED 100, which may have a first main surface 101 and a second main surface 102 that are opposite to each other. The LED 100 may include an electrode pad 130 located on the first main surface 101. A light-transmissive layer 200 may cover the second main surface 102 and at least some portions of side surfaces 103 of the LED 100, and be inclined with respect to the side surfaces 103 of the LED 100. A wavelength conversion layer 400 may be located on the light-transmissive layer 200 located on the second main surface 102. A coating layer 300 may expose the electrode pad 130, and surround the LED 100 and the light-transmissive layer 200.

FIG. 1B is a schematic cross-sectional view of a portion corresponding to a cross-section taken along a line B-B of FIG. 1A, that is, a line orthogonal to a pair of side surfaces 103 that opposite to each other. FIG. 1C is a schematic cross-sectional view of a portion corresponding to a cross-section taken along a line C-C of FIG. 1A, that is, a line consistent with a diagonal line of the LED 100 having a rectangular shape.

As shown in FIGS. 1B and 1C, the LED 100 may include a light-transmissive substrate 110 and a light-emitting structure 120 formed on a bottom surface of the light-transmissive substrate 110. The light-transmissive substrate 110 may have a top surface, a bottom surface opposite to the top surface, and side surfaces. Here, the top surface of the light-transmissive substrate 110 may form an interface with the light-transmissive layer 200. Light emitted by the light-emitting structure 120 may be extracted through the light-transmissive substrate 110 to a first surface 401 of the wavelength conversion layer 400 through light-transmissive layer 200. Also, light emitted from the side surfaces 103 of the light-emitting structure 120 may be reflected at an interface between the light-transmissive layer 200 and the coating layer 300, and extracted to the first surface 401 of the wavelength conversion layer 400.

The light-transmissive substrate 110 may come in contact with the light-emitting structure 120 and support the light-emitting structure 120. The light-transmissive substrate 110 may receive heat generated by the light-emitting structure 120 through a base layer (not shown) and dissipate the received heat to the outside. Also, the light-transmissive substrate 110 may have light transmissive characteristics. The light-transmissive substrate 110 may include a light-transmissive material or include a material capable of exhibiting light transmissive characteristics when the light-transmissive substrate 110 is formed to a predetermined thickness or less.

The light-transmissive substrate 110 may include an insulating substrate, a conductive substrate, or a semiconductor substrate as needed. For example, the light-transmissive substrate 110 may include sapphire ($Al_2O_3$), gallium nitride (GaN), germanium (Ge), gallium arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$).

In some embodiments, a sapphire substrate, a silicon carbide substrate, or a silicon substrate may be mainly used as the light-transmissive substrate 110. A sapphire substrate, which is more inexpensive than a silicon carbide substrate, may be used more frequently.

The light-emitting structure 120 may include a structure formed by sequentially stacking a first-conductivity-type semiconductor layer 121, an active layer 122, and a second-conductivity-type semiconductor layer 123. The first and second-conductivity-type semiconductor layers 121 and 123 may include semiconductors doped with p-type and n-type impurities, respectively. Conversely, the first and second-conductivity-type semiconductor layers 121 and 123 may include semiconductors doped with n-type and p-type impurities, respectively. The first and second-conductivity-type semiconductor layers 121 and 123 may include a nitride semiconductor, for example, $Al_xIn_yGa_{(1-x-y)}N$ ($0<x<1$, $0<y<1$, and $0<x+y<1$). However, in addition to the nitride semiconductor, the first and second-conductivity-type semiconductor layers 121 and 123 may include a GaAs-based semiconductor or a GaP-based semiconductor. In some embodiments, each of the first-conductivity-type semiconductor layer 121, the active layer 122, and the second-conductivity-type semiconductor layer 123 may be an epitaxial layer.

The active layer 122 between the first and second-conductivity-type semiconductor layers 121 and 123 may emit light having predetermined energy due to recombination between electrons and holes. In some embodiments, the active layer 122 may have a multiple quantum well (MQW) structure (e.g., an InGaN/GaN or AlGaN/GaN structure) in which quantum well layers and quantum barrier layers are alternately stacked. In other embodiments, the active layer 122 may have a single quantum well (SQW) structure. The light-emitting structure 120 may emit blue light, green light, red light, or infrared (IR) light depending on a material of a compound semiconductor included in the light-emitting structure 120. However, the wavelength conversion layer 400 formed on the LED 100 may change a wavelength of light generated by the light-emitting structure 120 and output light of various colors.

The light-emitting structure 120 may be electrically connected to the electrode pad 130. Specifically, the first and second-conductivity-type semiconductor layers 121 and 123 may be connected to first and second electrode pads 131 and 133, respectively.

A first electrode 125 may be formed through the second-conductivity-type semiconductor layer 123 and the active layer 122, and connected to the first-conductivity-type semiconductor layer 121. An insulating layer 124 may be formed on an outer sidewall of the first electrode 125 and a bottom surface of the second-conductivity-type semiconductor layer 123, and prevent direct electrical connection of the first electrode pad 131 with the active layer 122. The first electrode 125 may be electrically connected to the first electrode pad 131.

In addition, a second electrode 126 may be formed through the insulating layer 124 formed on the bottom surface of the second-conductivity-type semiconductor layer 123, and connected to the second-conductivity-type semiconductor layer 123. The second electrode 126 may be electrically connected to the second electrode pad 133.

Although FIG. 1D illustrates an example in which the light-emitting structure 120 includes the first-conductivity-type semiconductor layer 121, the active layer 122, the second-conductivity-type semiconductor layer 123, the insulating layer 124, the first electrode 125, and the second electrode 126, the inventive concept is not limited thereto. Also, a structure of electrical connection of the light-emitting structure 120 with the electrode pad 130 is not limited to an example shown in FIG. 1D.

The electrode pad 130 may include first and second electrode pads 131 and 133 configured to supply current to the LED 100 on the first main surface 101 of the LED 100. Each of the first and second electrode pads 131 and 133 may have an arbitrary shape. For example, when the LED package 10 is viewed from above, the first and second electrode pads 131 and 133 may have rectangular shapes, which may be located apart from each other in a first direction (X direction) and extend in a second direction (Y direction). In some embodiments, the first and second electrode pads 131 and 133 may not have the same shape.

The light-transmissive layer 200 may cover the second main surface 102 and at least some portions of the side surfaces 103 of the LED 100, and extract light emitted through the side surfaces 103 of the LED 100, toward the first surface 401 of the wavelength conversion layer 400. That is, before light reaching the side surface 103 of the LED 100 is reflected by the side surface 103 of the LED 100 and disappears in the LED 100, the light may be emitted through the light-transmissive layer 200 out of the LED 100. As described above, the LED package 10 may include the light-transmissive layer 200 to inhibit optical loss, so that light extraction efficiency of the LED package 10 may be effectively increased.

In another embodiment, the light-transmissive layer 200 may not completely cover the side surfaces 103 of the LED 100 but cover only some portions of the side surfaces 103 of the LED 100. Accordingly, in some embodiments, the side surfaces 103 of the LED 100 may be exposed from the light-transmissive layer 200 near edges of the first main surface 101 of the LED 100. However, since portions of the side surfaces 103, which are exposed by the light-transmissive layer 200, are covered by the coating layer 300, no portions of the side surfaces 103 of the LED 100 may be exposed outside the LED package 10. That is, a thickness 300T of the coating layer 300 may be greater than a thickness 200T of the light-transmissive layer 200.

In some embodiments, the thickness 200T of the light-transmissive layer 200 may be about 100 µm to about 350 µm, and the thickness 300T of the coating layer 300 may be about 150 µm to about 500 µm. Since the thickness 300T of the coating layer 300 is the sum of the thickness 200T of the light-transmissive layer 200 and a thickness of the electrode pad 130, a ratio of the thickness 200T of the light-transmissive layer 200 to the thickness 300T of the coating layer 300 may be about 1:1.1 to about 1:2.

As described above, the light-transmissive layer 200 may be a member configured to emit light reaching the side surface 103 of the LED 100 out of the LED 100 before the light is reflected by the side surface 103 of the LED 100 and disappears inside the LED 100. Accordingly, when an area of the light-transmissive layer 200 is rapidly changed according to position on the side surface 103 of the LED 100, optical characteristics may be changed at an interface between the LED 100 and the light-transmissive layer 200.

That is, part of light that is emitted by the light-emitting structure 120 and reaches to the side surface 103 of the LED 100 may not be reflected at an interface between the light-transmissive layer 200 and the coating layer 300 but disappear. As a result, the intensity of light reflected by an interface between a thin portion of the light-transmissive layer 200 and the coating layer 300 may be lower than the intensity of light reflected by an interface between a thick portion of the light-transmissive layer 200 and the coating layer 300. Accordingly, light extraction efficiency of the LED package 10 may be degraded, and emission characteristics of the LED package 10 may be changed.

In other words, when viewed from above, i.e., in a plan view, an area of the light-transmissive layer 200 formed at a corner portion of the LED 100 may be greatly different from areas of other portions of the light-transmissive layer 200. In this case, when light reaches the side surface 103 on which the light-transmissive layer 200 is formed to have a relatively small area, efficiency of extraction of the light to the LED package 10 through the light-transmissive layer 200 may be reduced.

Therefore, in the LED package 10 according to an example embodiment, when viewed from above, the light-transmissive layer 200 may be formed on the side surface 103 of the LED 100 such that a length 200C of a diagonal line of the light-transmissive layer 200 is equal to or greater than a length 200B of each side of the light-transmissive layer 200, or, in a sectional view of the LED package 10, an angle $\theta_B$ formed by an edge connecting two adjacent side surfaces of the light-transmissive layer 200 and a corresponding edge of the LED 100 is greater than or equal to an angle $\theta_A$ formed by a side surface of the light-transmissive layer 200 and a corresponding side surface of the LED 100 referring back to FIGS. 1B and 1C. Thus, the light-transmissive layer 200 may be prevented from being formed to a small width at the corner portion of the LED 100. When viewed from above, a center of the LED 100 may coincide with a center of the light-transmissive layer 200, the LED 100 may have a tetragonal shape with a first area, and the light-transmissive layer 200 may have a second area larger than the first area and have the same shape as the LED 100. Thus, the first area of the LED 100 may be about 19.8% to about 82.6% of the second area of the light-transmissive layer 200.

In some embodiments, a first-directional (X-directional) length 100X of a side of the LED 100 may be about 400 µm to about 3000 µm. A second-directional (Y-directional) length of a side of the LED 100 may be equal to or different from the first-directional (X-directional) length 100X of the side of the LED 100. In other words, the LED 100 may have a regular tetragonal shape or a rectangular shape when viewed from above.

In addition, a first-directional (X-directional) length 200X of the light-transmissive layer 200 from a corner of the LED 100, a second-directional (Y-directional) length 200Y of the light-transmissive layer 200 from the corner of the LED 100, and a diagonal length 200D of the light-transmissive layer 200 from the corner of the LED 100 will now be described. Each of the first-directional (X-directional) length 200X and the second-directional (Y-directional) length 200Y from the corner of the LED 100 may be about 100 µm to about 1500 µm. The diagonal length 200D may be about 140 µm to about 2100 µm based on the Pythagorean theorem. The first-directional (X-directional) length 200X of the light-transmissive layer 200 from the corner of the LED 100 may be equal to or different from the second-directional (Y-directional) length 200Y of the light-transmissive layer 200 from the corner of the LED 100. That is, a length of one side of the light-transmissive layer 200 may be about 600 µm to about 6000 µm.

The coating layer 300 may have a single layer or a multilayered structure formed by alternately stacking dielectric layers having different refractive indices. For example, the coating layer 300 may be a single layer including at least one selected from the group consisting of $SiO_2$, $MgF_2$, SiN, $TiO_2$, and $Nb_2O_5$ or have a multilayered structure formed by alternately stacking the above-described materials.

The wavelength conversion layer 400 may include phosphor. The phosphor may be a resin containing a wavelength conversion material. For example, the wavelength conversion material may be a fluorescent material, and the resin may be a silicone resin, an epoxy resin, or a resin mixture thereof. In some embodiments, the wavelength conversion layer 400 may have electrical insulation characteristics.

The wavelength conversion layer 400 may include at least two types of materials capable of providing light having different wavelengths. In some embodiments, the wavelength conversion layer 400 may include a material containing a mixture of green phosphor powder and red phosphor powder. In other embodiments, the wavelength conversion layer 400 may have a structure in which a plurality of wavelength conversion layers are stacked. For example, the wavelength conversion layer 400 may have a structure in which a first wavelength conversion layer configured to output green light and a second wavelength conversion layer configured to output red light are stacked. Thus, the wavelength conversion layer 400 may convert light generated by the light-emitting structure 120 into white light or light having a specific wavelength.

A side surface of the wavelength conversion layer 400 may be coplanar with a side surface of the coating layer 300 due to a later-described manufacturing process. That is, when viewed from above, the LED package 10 may expose only the wavelength conversion layer 400.

When viewed from above, a center of the light-transmissive layer 200 may coincide with a center of the wavelength conversion layer 400, and the wavelength conversion layer 400 may have a tetragonal shape in which an area occupied by the wavelength conversion layer 400 is larger than an area occupied by the light-transmissive layer 200.

Referring to FIG. 1E, an LED package 11 may be similar to the LED package 10 of FIGS. 1A to 1D except that a portion of an electrode pad 130 protrudes from a coating layer 300. An exposed surface of the electrode pad 130 may protrude from the coating layer 300. Portions of side surfaces of the electrode pad 130 may not be covered with the coating layer 300 but exposed. That is, the electrode pad 130 may protrude more outward than the coating layer 300.

Referring to FIG. 1F, an LED package 12 may be similar to the LED package 11 of FIG. 1E except that a coating layer 300 has inclined surfaces so that a thickness of the coating layer 300 may increase toward side surfaces of an electrode pad 130. The inclined surfaces of the coating layer 300 may be in contact with the side surfaces of the electrode pad 130 and have a concavely curved shape along the side surfaces of the electrode pad 130. Portions of the coating layer 300, which are in contact with the side surfaces of the electrode pad 130, may have a meniscus shape along the side surfaces of the electrode pad 130.

Referring to FIG. 1G, an LED package 13 may be similar to the LED package 11 of FIG. 1E except that a coating layer 300 has inclined surfaces so that a thickness of the coating layer 300 may be decrease toward side surfaces of an electrode pad 130. The inclined surfaces of the coating layer 300 may be in contact with the side surfaces of the electrode pad 130 and have a convexly curved shape along the side surfaces of the electrode pad 130.

Figure 2A:
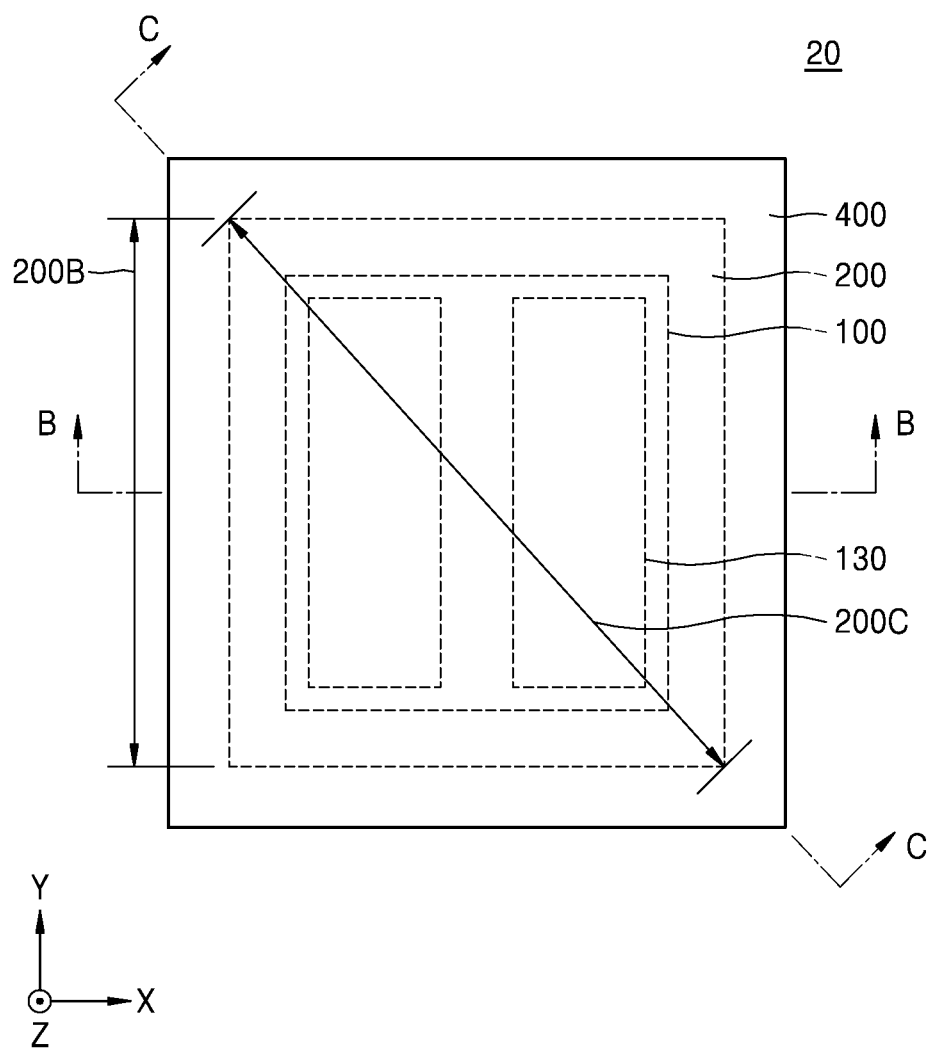
FIGS. 2A to 2E are diagrams of an LED package including a plan view and sectional views, according to an example embodiment.
Figure 2B:
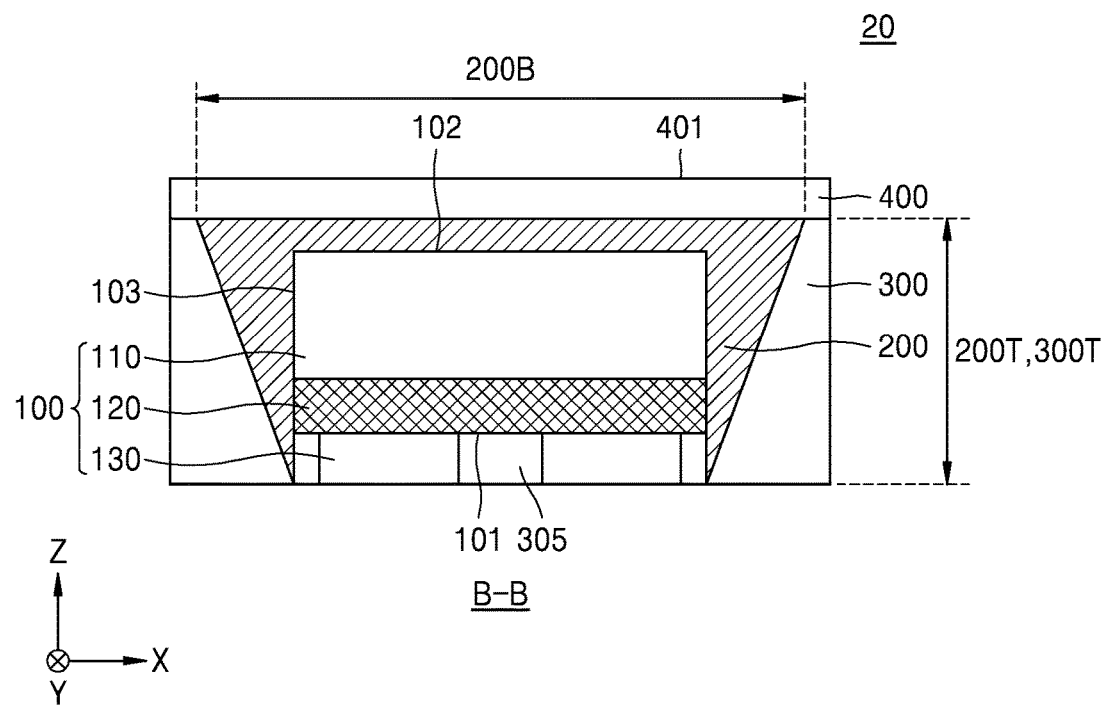
Figure 2C:
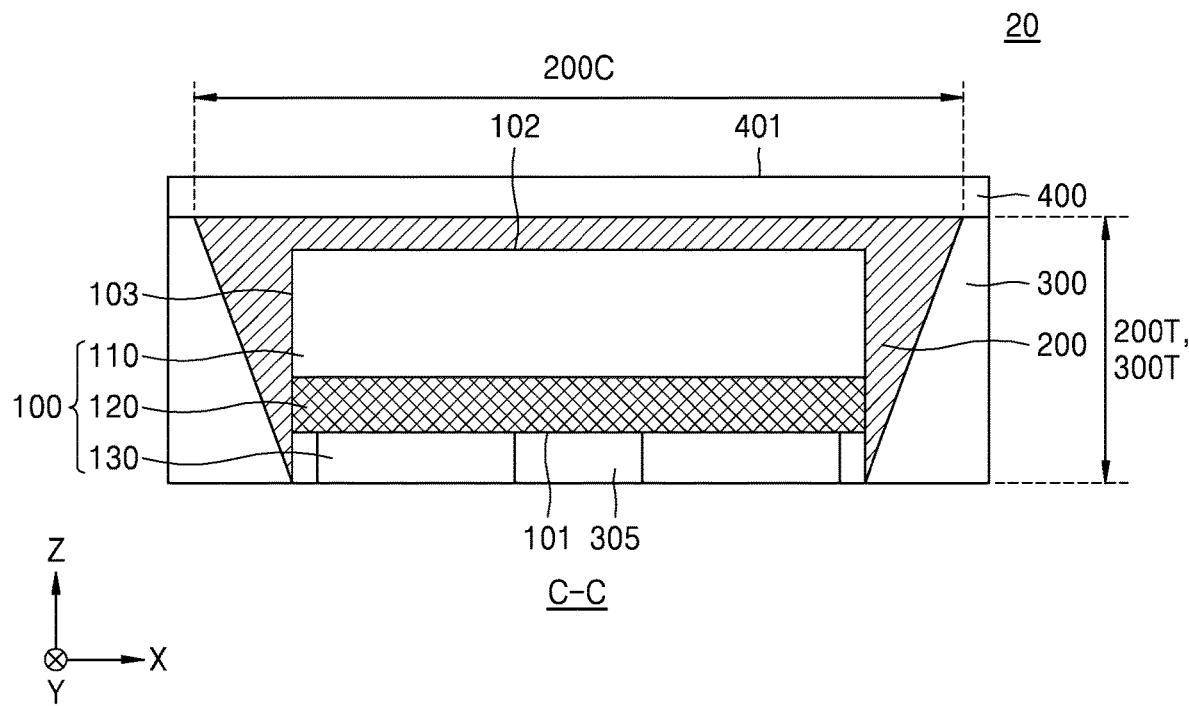
Figure 2D:
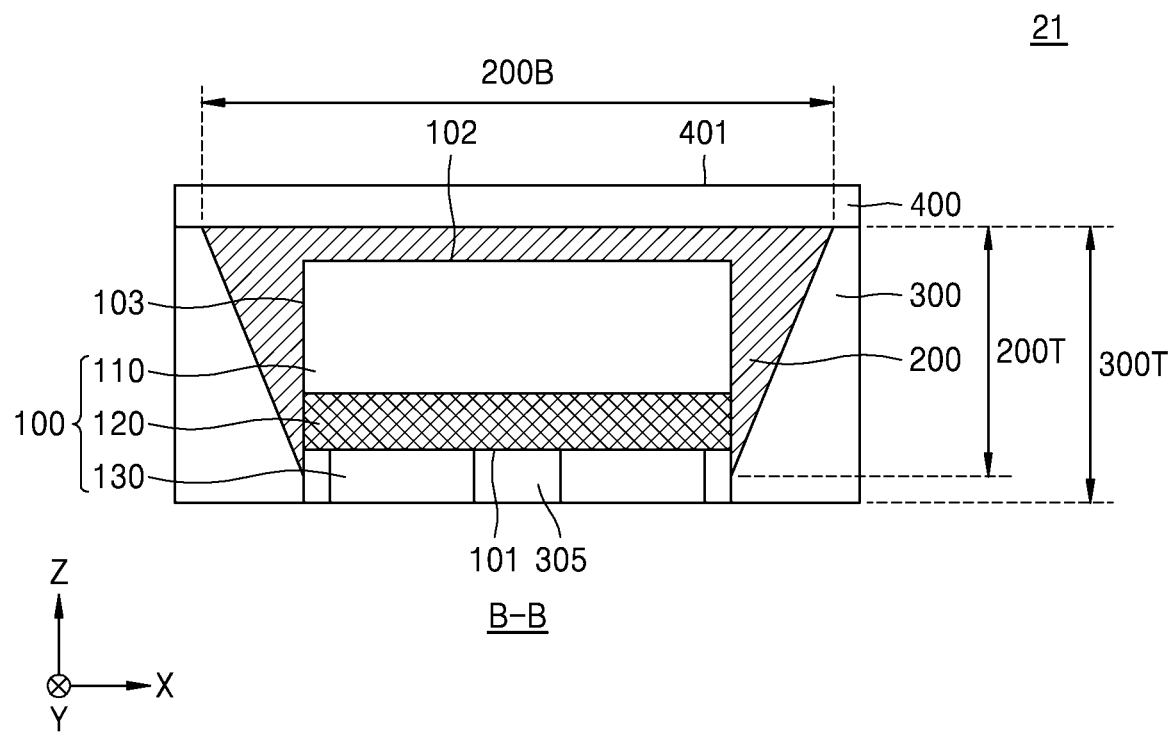
Figure 2E:
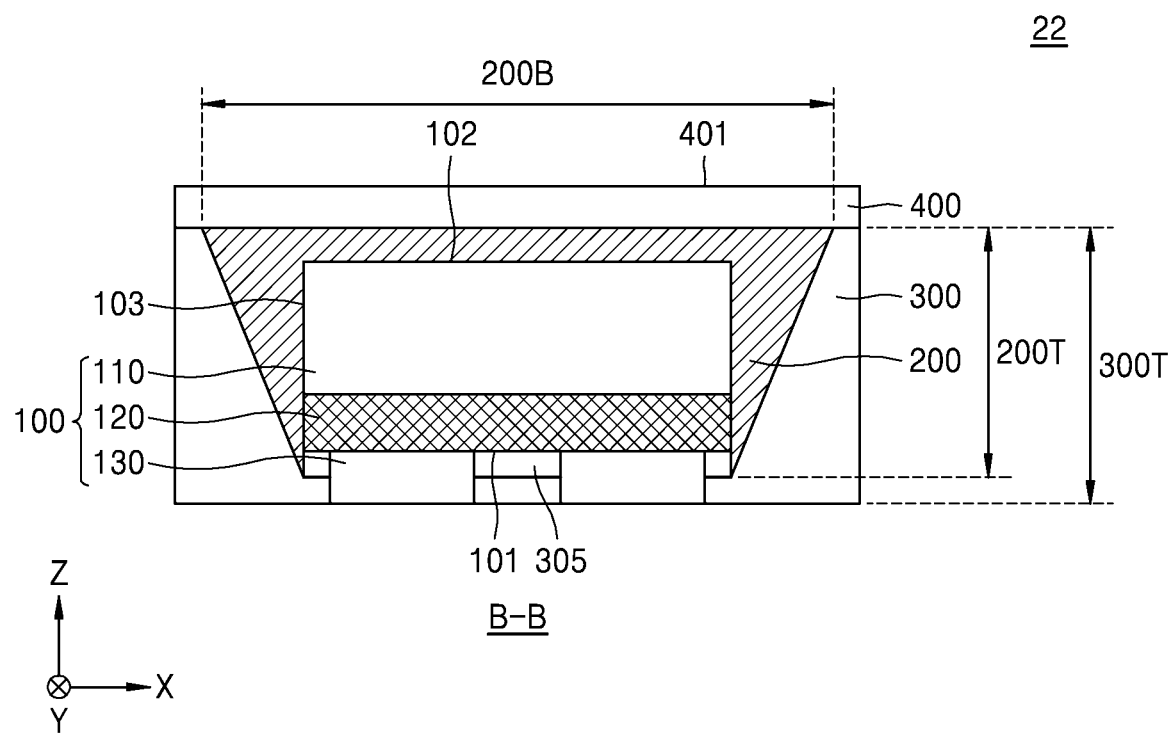

FIG. 2A is a plan view of an LED package 20 according to an example embodiment. FIG. 2B is a cross-sectional view of a portion corresponding to a cross-section taken along a line B-B of FIG. 2A. FIG. 2C is a cross-sectional view of a portion corresponding to a cross-section taken along a line C-C of FIG. 2A. FIGS. 2D and 2E are cross-sectional views of LED packages according to other example embodiments, which have some differences from the LED package 20 of FIG. 2B.

Referring to FIGS. 2A to 2C, the LED package 20 may be similar to the LED package 10 of FIGS. 1A to 1D except that a light-transmissive layer 200 covers all side surfaces 103 of an LED 100, and reaches the same level as an exposed surface of an electrode pad 130. The same reference numerals are used to denote the same elements as in FIGS. 1A to 1C, and the same descriptions as in FIGS. 1A to 1C will be omitted for brevity.

A light-transmissive layer 200 may be located in the LED package 20 at the same level as an exposed surface of the electrode pad 130. That is, a thickness 200T of the light-transmissive layer 200 may be substantially equal to a thickness 300T of a coating layer 300.

In this case, side surfaces of the electrode pad 130 may be surrounded by an electrode coating layer 305. The above-described structure may be obtained by forming the light-transmissive layer 200 after manufacturing the LED 100 in which the electrode coating layer 305 is previously formed. In the LED package 20, since the light-transmissive layer 200 is formed on all the side surfaces 103 of the LED 100, light extraction efficiency of the LED package 20 may be effectively increased.

Referring to FIG. 2D, an LED package 21 may be similar to the LED package 20 of FIGS. 2A to 2C except that a light-transmissive layer 200 is formed to cover only a portion of a side surface of an electrode coating layer 305. Accordingly, the light-transmissive layer 200 may be aligned to a level that is higher by a predetermined distance than an exposed surface of the electrode pad 130. That is, the thickness 300T of the coating layer 300 may be greater than the thickness 200T of the light-transmissive layer 200.

Referring to FIG. 2E, an LED package 22 may be similar to the LED package 20 of FIGS. 2A to 2C except that only portions of side surfaces of an electrode pad 130 is surrounded by an electrode coating layer 305. Accordingly, the electrode coating layer 305 may be covered with a coating layer 300. Also, a light-transmissive layer 200 may be aligned to a level that is higher by a predetermined distance than an exposed surface of the electrode pad 130. A thickness 300T of a coating layer 300 may be greater than a thickness 200T of the light-transmissive layer 200.

Figure 3A:
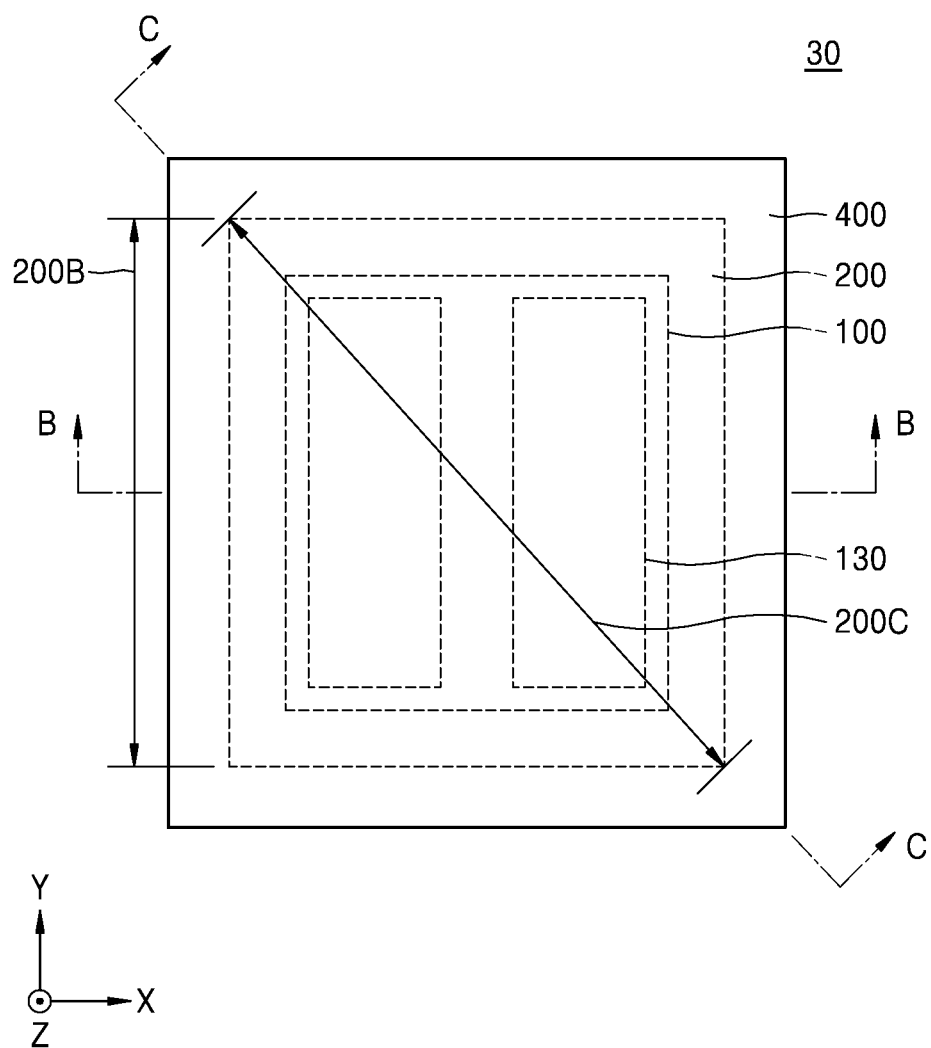
FIGS. 3A to 3C are diagrams of an LED package including a plan view and sectional views, according to an example embodiment.
Figure 3B:
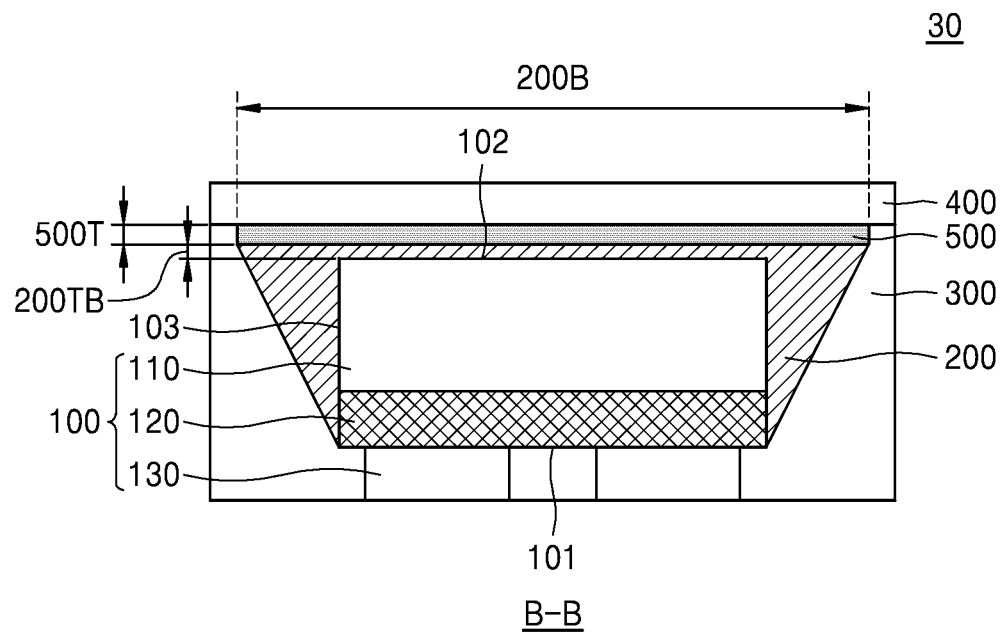
Figure 3C:
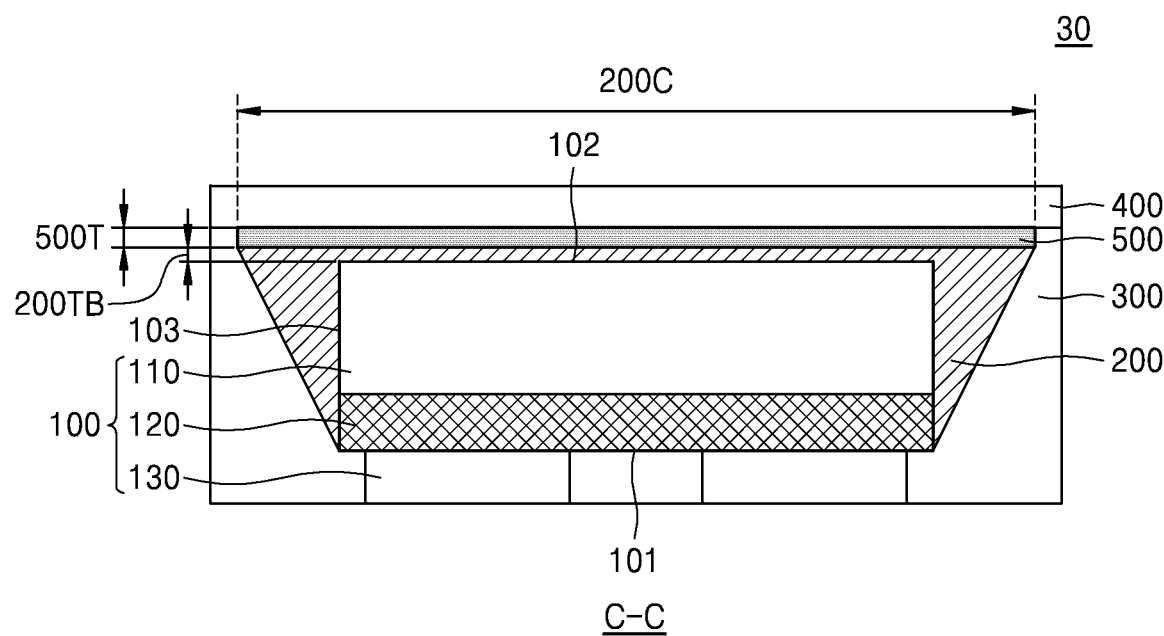

FIG. 3A is a plan view of an LED package 30 according to an example embodiment. FIG. 3B is a cross-sectional view of a portion corresponding to a cross-section taken along a line B-B of FIG. 3A. FIG. 3C is a cross-sectional view of a portion corresponding to a cross-section taken along a line C-C of FIG. 3A.

Referring to FIGS. 3A to 3C, the LED package 30 may be similar to the LED package 10 of FIGS. 1A to 1D except that an interlayer 500 is located between a light-transmissive layer 200 and a wavelength conversion layer 400. The same reference numerals are used to denote the same elements as in FIGS. 1A to 1C, and the same descriptions as in FIGS. 1A to 1C will be omitted for brevity.

Two functions of the interlayer 500 included in the LED package 30 according to the inventive concept will now be described.

First, an LED package 30 having a graded index effect may be formed to increase efficiency of extraction of light generated by a light-emitting structure 120 out of the LED package 30. In some embodiments, a critical angle at which light may be emitted may be reduced due to a large difference in refractive index between a light-transmissive substrate 110 (e.g., a sapphire substrate having a refractive index of about 1.75) and the wavelength conversion layer 400 (having a refractive index of about 1.48) so that optical loss due to total internal reflection may occur. Therefore, to reduce the optical loss due to the total internal reflection, the interlayer 500 including a material having an intermediate refractive index between the light-transmissive substrate 110 and the wavelength conversion layer 400 may be inserted therebetween, thereby effectively increasing light extraction efficiency. A layer for obtaining the graded index effect may be divided into four layers including the light-transmissive layer 200. A material having a higher refractive index than the interlayer 500 may be selected as a raw material included in the light-transmissive layer 200.

That is, the LED package 30 having the graded index effect may be formed by selecting respective materials such that a refractive index of the light-transmissive substrate 110 is higher than a refractive index of the light-transmissive layer 200, a refractive index of the light-transmissive layer 200 is higher than a refractive index of the interlayer 500, and a refractive index of the interlayer material layer 500 is higher than a refractive index of the wavelength conversion layer 400. 110>200>500>400

Second, the interlayer 500 may function as a buffer layer configured to control a shape of the light-transmissive layer 200. If the interlayer 500 is not present, a sectional shape of the light-transmissive layer 200 may be determined by surface tension between the raw material included in the light-transmissive layer 200 and the wavelength conversion layer 400, and the light-transmissive layer 200 may be formed in a concave shape due to a difference in surface tension according to material. In this case, simulation results show that light extraction efficiency may be reduced by up to 1.8%. Accordingly, to overcome the above-described phenomenon, the interlayer 500 may function as the buffer layer configured to prevent the light-transmissive layer 200 from being formed in a concave sectional shape.

When the LED package 30 is viewed from above, a center of the LED 100, a center of the light-transmissive layer 200, and a center of the interlayer 500 may coincide with each other, the LED 100 may have a tetragonal shape with a first area, the interlayer 500 may have an N-angled shape with a second area larger than the first area (N is a natural number equal to or more than 4), and the light-transmissive layer 200 may be formed to have the same area and shape as those of the interlayer 500. (differ from the shape of the LED?)

In some embodiments, when viewed from above, the interlayer 500 may have a tetragonal shape, and respective corners of the LED 100, the light-transmissive layer 200, the interlayer 500, and the wavelength conversion layer 400 may be located in a straight line.

In addition, on a second main surface 102 of the LED 100, a thickness 500T of the interlayer 500 may be greater than a thickness 200TB of the light-transmissive layer 200 formed between the light-transmissive substrate 110 and the interlayer 500.

Figure 4:
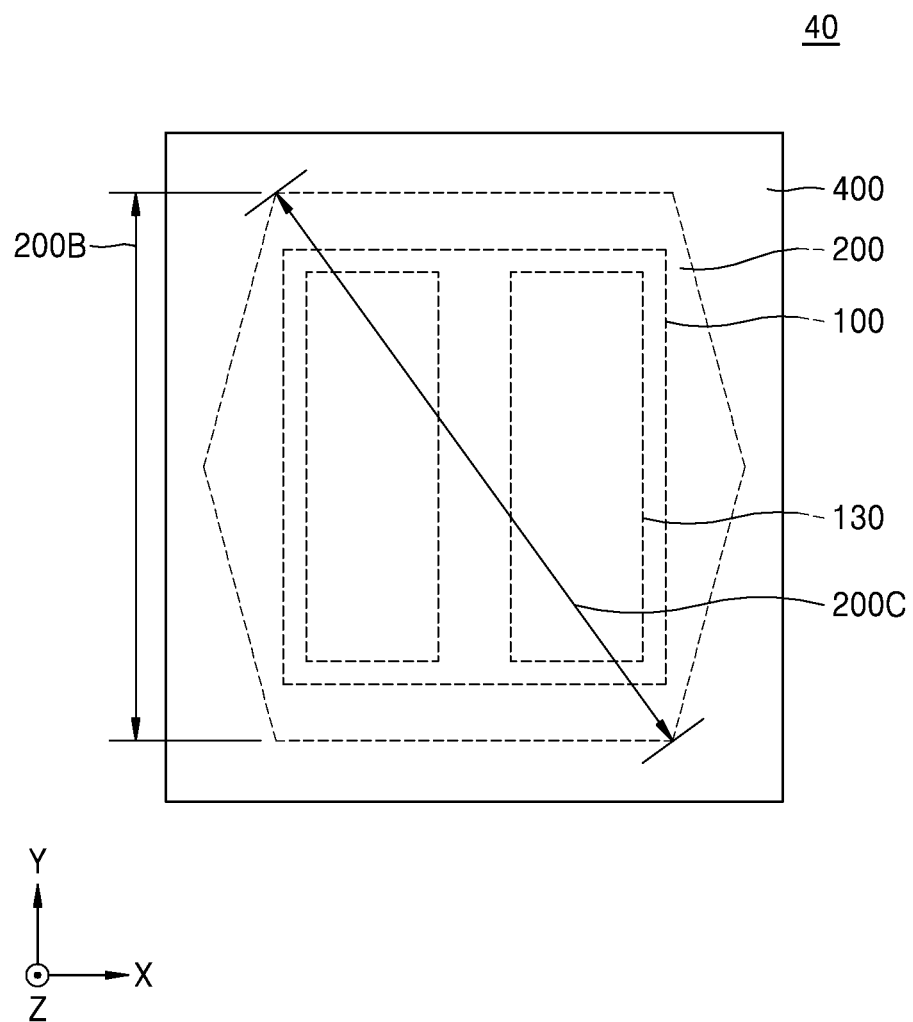
FIG. 4 is a plan view of an LED package according to an example embodiment.

FIG. 4 is a plan view of an LED package 40 according to an example embodiment.

Referring to FIG. 4, the LED package 40 may be similar to the LED package 10 of FIG. 1A except that a planar shape of a light-transmissive layer 200 is a hexagonal shape. The same reference numerals are used to denote the same elements as in FIG. 1A, and the same descriptions as in FIG. 1A will be omitted for brevity.

When the LED package 40 is viewed from above, a center of the LED 100 may coincide with a center of the light-transmissive layer 200, the LED 100 may have a tetragonal shape with a first area, and the light-transmissive layer 200 may have an N-angled shape with a second area larger than the first area (N is a natural number equal to or more than 4).

Although FIG. 4 illustrates an example in which the light-transmissive layer 200 has a hexagonal shape (N=6), the inventive concept is not limited thereto. As described below, in the LED package 40, the light-transmissive layer 200 may be formed in a desired shape corresponding to a shape of the LED 100 using a screen printing process. Accordingly, an LED package 40 having improved light extraction efficiency may be efficiently manufactured.

FIG. 5 is a process flowchart of a method of manufacturing an LED package, according to an example embodiment.

Referring to FIG. 5, the method of manufacturing the LED package may include the following process sequence. When an embodiment is implemented otherwise, a specific process sequence may be performed differently from that described. For example, two sequentially described processes may be performed substantially concurrently or in reverse order to that described.

The method may include manufacturing an LED including first and second main surfaces, opposite to each other, and including an electrode pad located on the first main surface (S110), coating a wavelength conversion layer with a liquid light-transmissive material in an N-angled planar shape (N is a natural number equal to or more than 4) to a predetermined thickness (S120), locating the second main surface of the LED on the light-transmissive material to come in contact with the light-transmissive material (S130), applying a predetermined pressure to the LED such that the light-transmissive material covers the second main surface and at least portions of side surfaces of the LED and is inclined with respect to the side surfaces of the LED (S140), curing the light-transmissive material to form a light-transmissive layer (S150), forming a coating layer to expose an electrode pad and surround the LED and the light-transmissive layer (S160), and cutting the coating layer and the wavelength conversion layer to the outside of the light-transmissive layer (S170).

In general, a chip-scale package (CSP)-type LED package may include a light-transmissive layer and a coating layer, which are located around an LED, to enhance extraction efficiency of light emitted by the LED. In recent years, a reduction in the size of LEDs has led to a need for LED packages including a stable light-transmissive layer and coating layer, which may effectively increase light extraction efficiency.

Accordingly, the method of manufacturing the LED package may include forming the light-transmissive layer in a shape corresponding to a shape of the LED, so that light extraction efficiency of the LED may be effectively increased. Also, in the method of manufacturing the LED package, the light-transmissive layer included in the LED package may be formed in a desired shape. Therefore, LED packages having improved light extraction efficiency may be efficiently produced.

Technical characteristics of the respective operations will be described in detail below with reference to FIGS. 6A to 9B.

FIGS. 6A to 9B are diagrams of process operations of a method of manufacturing an LED package, according to an example embodiment.

Specifically, FIGS. 6B, 7B, 8B, and 9B are cross-sectional views of portions corresponding to cross-sections taken along lines B-B of FIGS. 6A, 7A, 8A, and 9A, respectively. A method of manufacturing the LED package 10 described with reference to FIGS. 1A to 1D, according to an example embodiment, will be described with reference to FIGS. 6A to 9B.

Figure 6A:
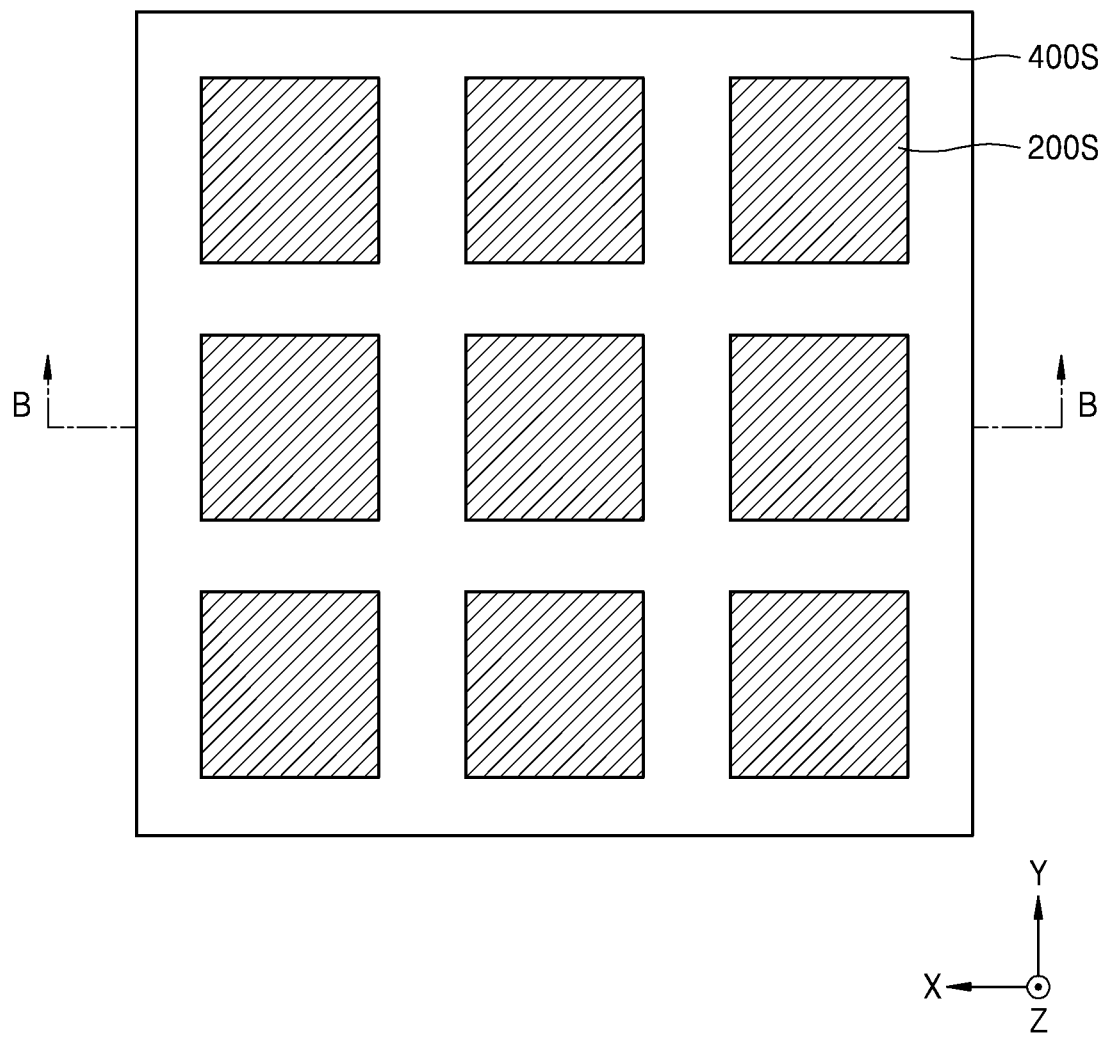
FIGS. 6A to 9B are diagrams of process operations of a method of manufacturing an LED package, according to an example embodiment.
Figure 6B:
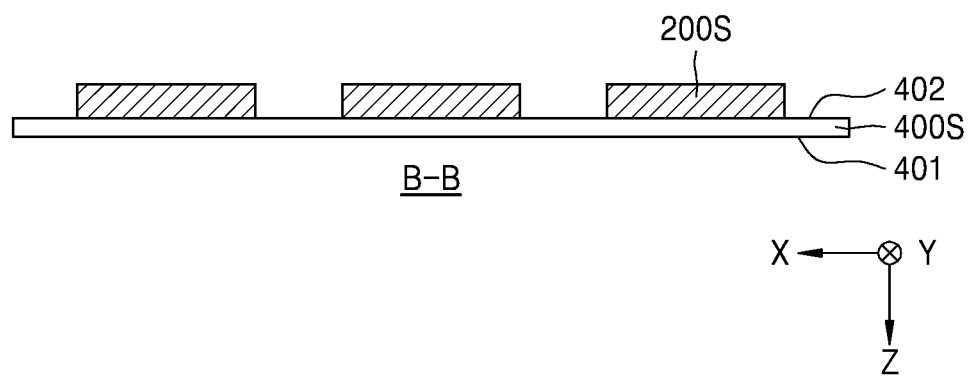

Referring to FIGS. 6A and 6B, a second surface 402 opposite to a first surface 401 of a wavelength conversion film 400S may be coated with a plurality of light-transmissive material piles 200S (e.g., a liquid resin material) having isolated planar tetragonal shapes. In this case, the plurality of light-transmissive material piles 200S having the planar tetragonal shapes may be located on one-sheet wavelength conversion film 400S using a relatively large wavelength conversion film 400S. When a distance between adjacent ones of the plurality of light-transmissive material piles 200S having the planar tetragonal shapes is excessively large, the number of LED packages that may be formed simultaneously may be reduced, and production efficiency of the LED packages may be degraded. Accordingly, the light-transmissive material piles 200S may be arranged at appropriate intervals.

The light-transmissive material piles 200S may be formed on the second surface 402 of the wavelength conversion film 400s by coating using a screen printing process, an imprint process, or a lithography process to have a predetermined shape.

Here, the light-transmissive material piles 200S may be formed in a shape corresponding to a shape of LEDs so that light extraction efficiency of the LEDs may be effectively increased. Also, the light-transmissive material piles 200S may be formed in a desired shape using a screen printing process, thereby enabling efficient production of LED packages having enhanced light extraction efficiency.

Figure 7A:
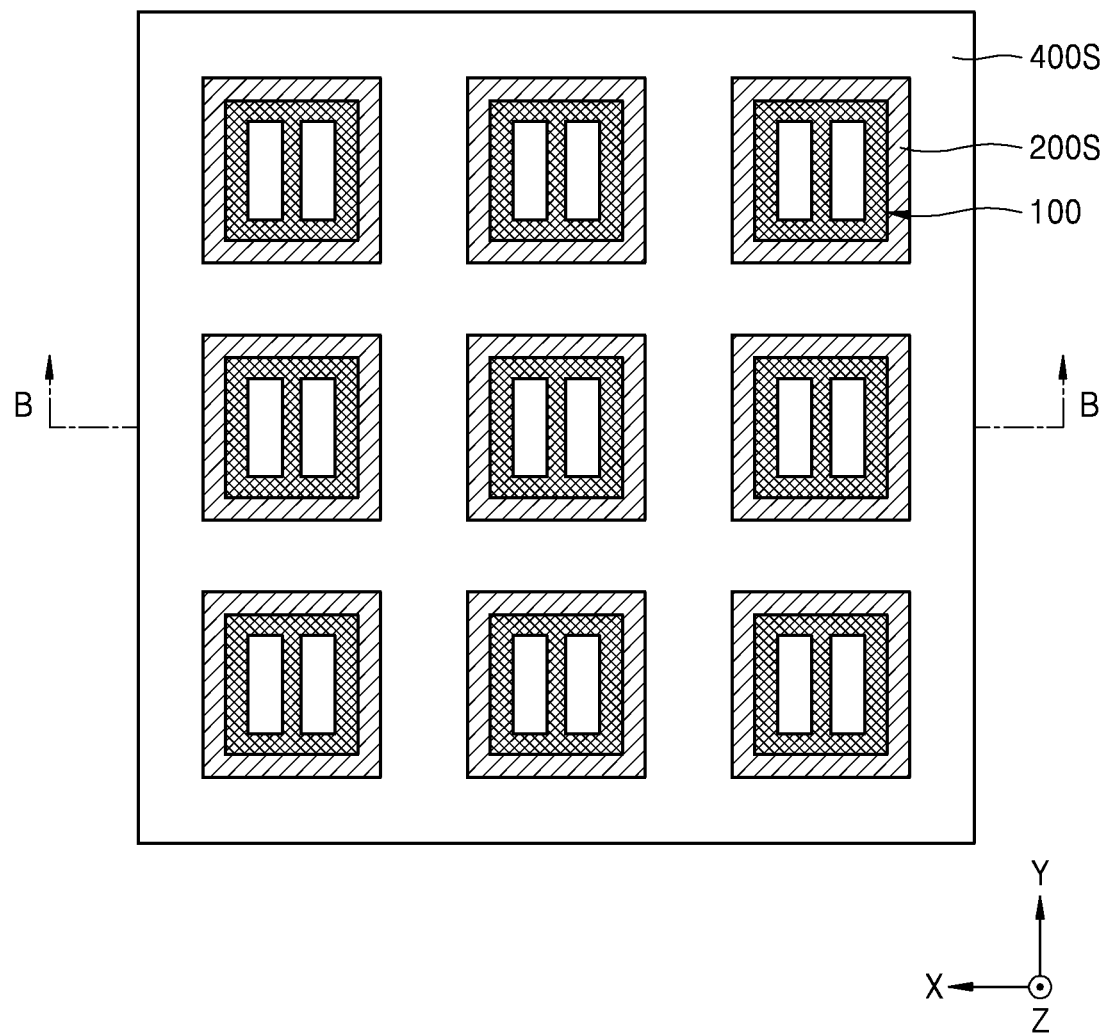
Figure 7B:
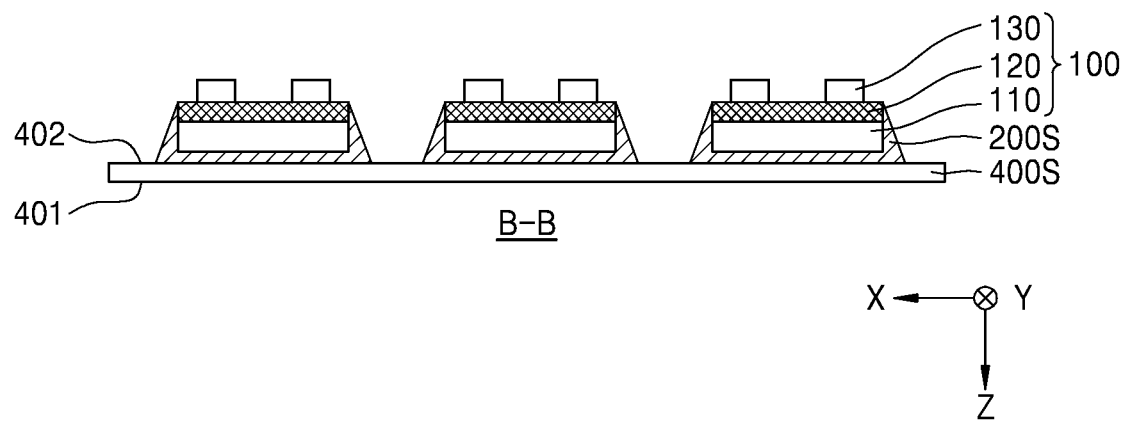

Referring to FIGS. 7A and 7B, LEDs 100 may be disposed on a plurality of light-transmissive material piles 200S having planar tetragonal shapes. Only by disposing the LEDs 100 on the plurality of light-transmissive material piles 200S having the planar tetragonal shapes or by applying pressure to the LEDs 100 after locating the LEDs 100 on the plurality of light-transmissive material piles 200S, the light-transmissive material may rise to side surfaces 103 of the LEDs 100, and outer surfaces of the light-transmissive material 200S may be deformed in a downwardly unfolded shape. (by surface tension)

A planar shape of each of the light-transmissive material piles 200S may be deformed by disposing the LED 100 thereon or application of pressure to become almost equal to an outer shape of a light-transmissive layer (refer to 200 in FIG. 9B) included in an LED package (refer to 10 in FIG. 9B), which is a final product. Also, the light-transmissive material may be provided as a film type between the wavelength conversion film 400S and a light-transmissive substrate 110 of the LED 100. The light-transmissive layer (refer to 200 in FIG. 9B) formed by curing the light-transmissive material may serve as an adhesive between the wavelength conversion film 400S and the LED 100. A thickness of the light-transmissive material may be determined considering adhesiveness and heat dissipation characteristics of the LED 100.

Figure 8A:
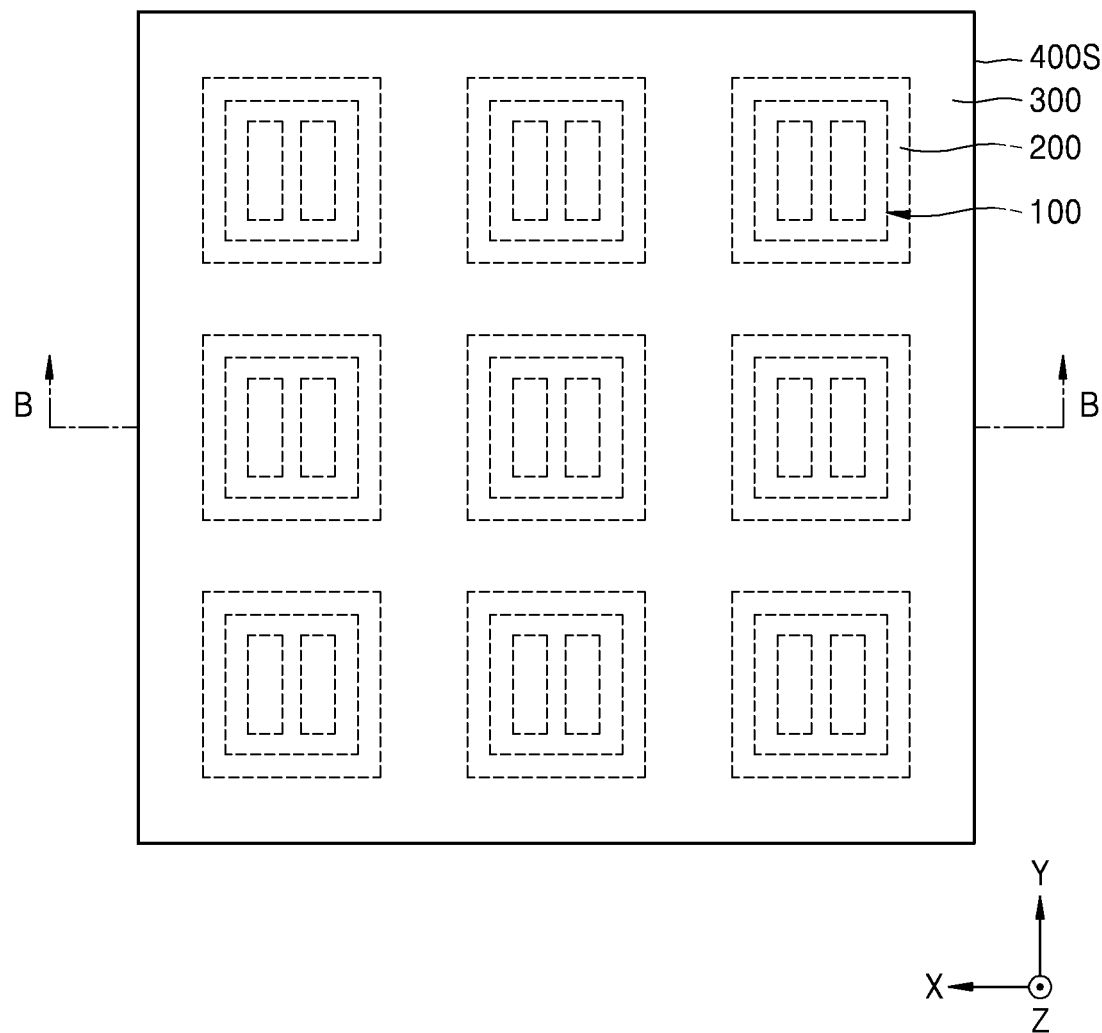
Figure 8B:
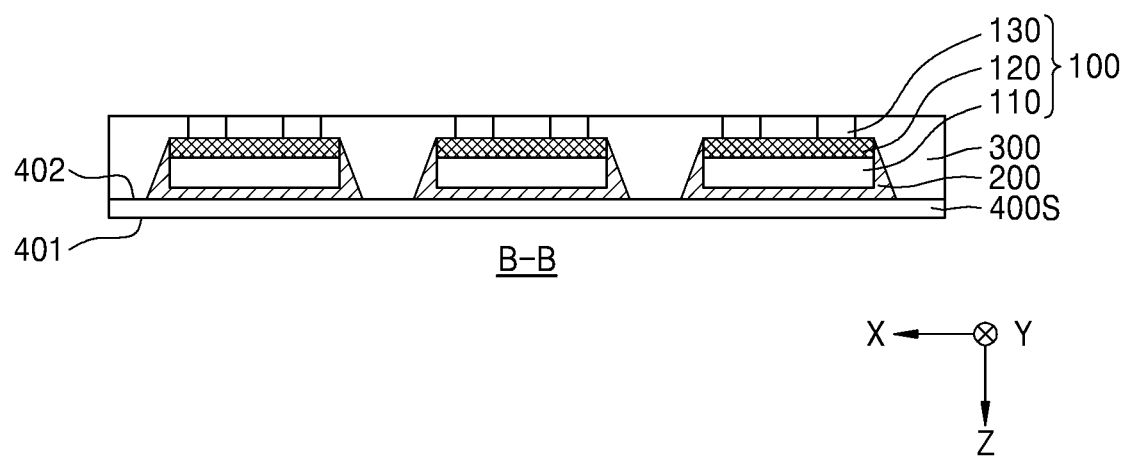

Referring to FIGS. 8A and 8B, after the light-transmissive layer 200 is formed by curing the light-transmissive material (refer to 200S in FIG. 7B), a coating layer 300 may be formed on an outer surface of the light-transmissive layer 200 and a portion of the second surface 402 of the wavelength conversion film 400S, which is not covered with the light-transmissive layer 200. Also, the coating layer 300 may be formed on a portion of a light-emitting structure 120 of the LED 100, which is not covered with an electrode pad 130. In this case, a thickness of the coating layer 300 may be controlled such that a portion of the electrode pad 130 is exposed by the coating layer 300. That is, a level of an uppermost surface of the coating layer 300 may be equal to or lower than a level of a top surface of the electrode pad 130, based on the second surface 402 of the wavelength conversion film 400S. In this case, a plurality of light-transmissive layers 200 formed around a plurality of LEDs 100 located on the wavelength conversion film 400S may be completely covered with one continuous coating layer 300.

Figure 9A:
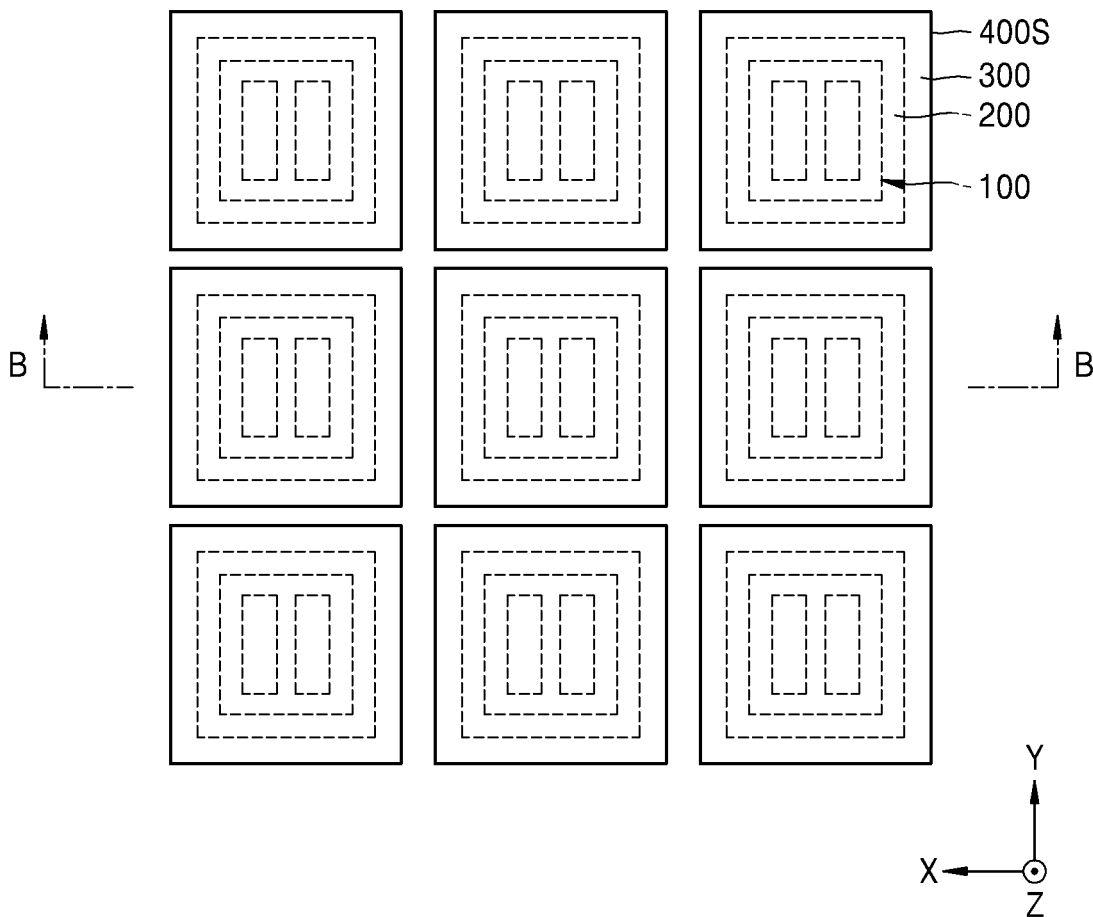
Figure 9B:
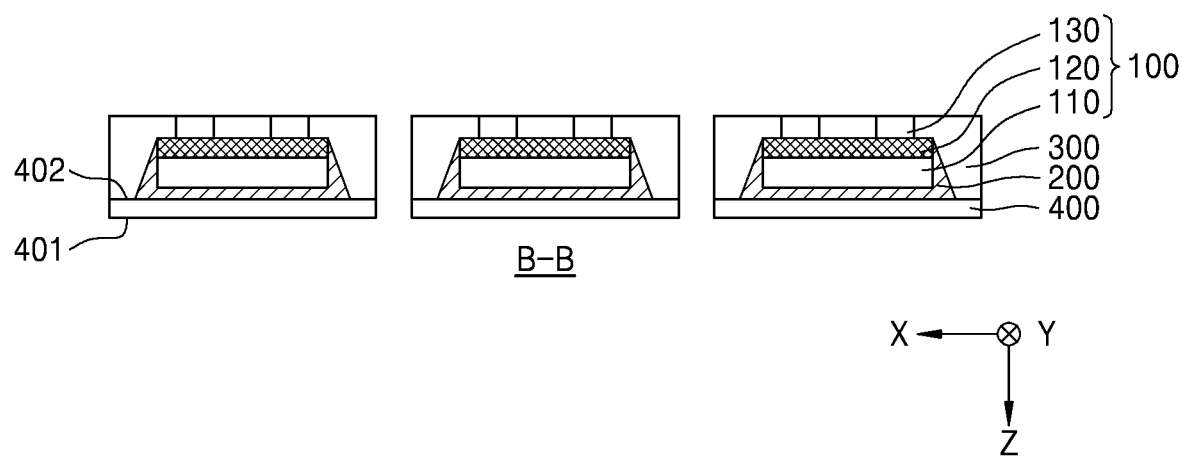

Referring to FIGS. 9A and 9B, the coating layer 300 and the wavelength conversion film 400S may be cut using a cutting process along a middle region (e.g., a scribe lane) between adjacent LEDs 100. The coating layer 300 and the wavelength conversion film 400S may be physically separated into respective LED packages 10 using the cutting process. In the above-described method, a plurality of LED packages 10, each of which includes the LED 100, the light-transmissive layer 200, the coating layer 300, and the wavelength conversion layer 400, may be manufactured simultaneously.

As a result, the LED package 10, in which when viewed from above, a length of a diagonal line of the light-transmissive layer 200 is greater than a length of each side of the light-transmissive layer 200 and a side surface of the wavelength conversion layer 400 is coplanar with a side surface of the coating layer 300, may be manufactured.

Figure 10A:
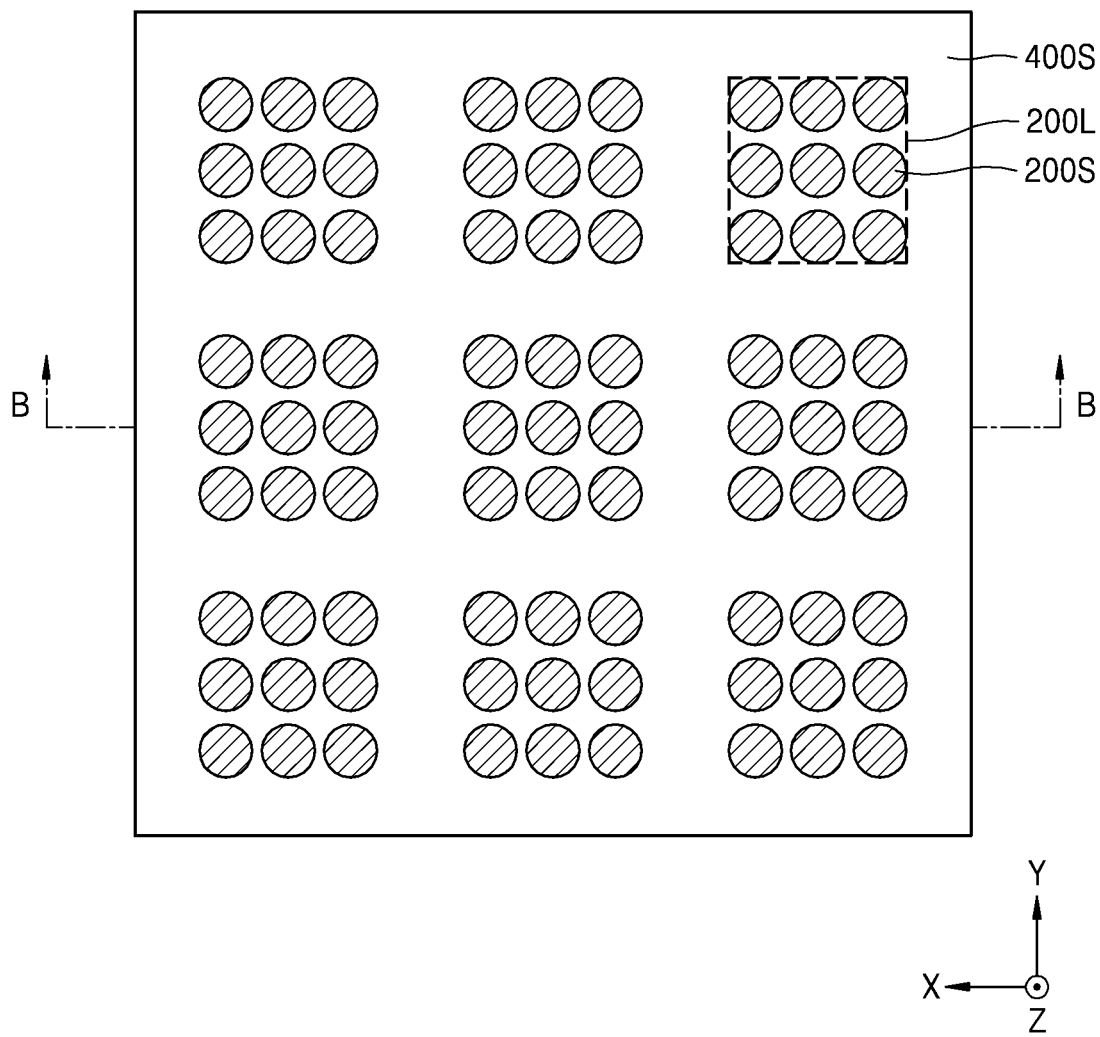
FIGS. 10A and 10B are diagrams of process operations of a method of manufacturing an LED package, according to an example embodiment.
Figure 10B:
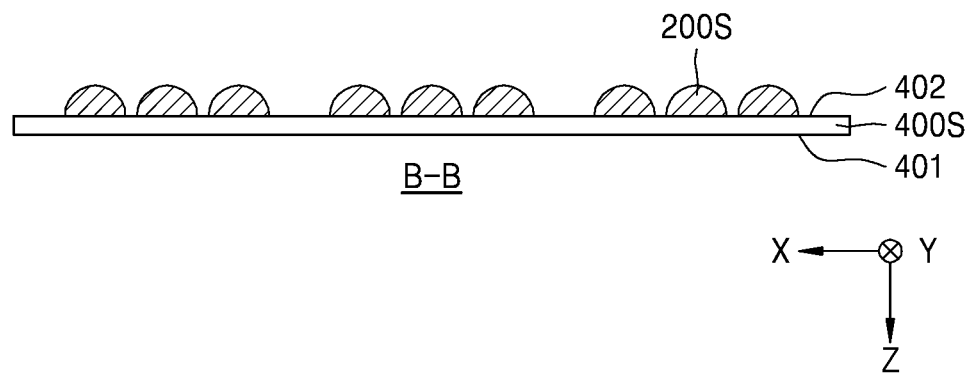

FIGS. 10A and 10B are diagrams of process operations of a method of manufacturing an LED package 10 according to an example embodiment. Specifically, FIG. 10B is a cross-sectional view of a portion corresponding to a cross-section taken along a line B-B of FIG. 10A. A method of manufacturing the LED package 10 described with reference to FIGS. 1A to 1D will be described with reference to FIGS. 10A and 10B.

Referring to FIGS. 10A and 10B, a plurality of light-transmissive material piles 200S may be formed on a second surface 402 of a wavelength conversion film 400S. When the light-transmissive material piles 200S include a light-transmissive resin material, boundaries and insides of regions in which LEDs 100 will be located may be coated with the light-transmissive material (e.g., a liquid resin material) using a dispenser.

In other words, when the light-transmissive material is coated, a plurality of dot shapes may be formed using a dispensing process such that an imaginary outermost connecting line 200L has an N-angled planar shape (N is a natural number equal to or more than 4), or a plurality of ball-shaped light-transmissive material piles may be formed in a matrix form to correspond to each LED 100.

When the light-transmissive material is coated using a liquid resin material by a dispensing process, the light-transmissive material may spread on the wavelength conversion film 400S and simultaneously, be formed in dot shapes due to surface tension. A viscosity and coated amount of the liquid resin material may be controlled such that each of the light-transmissive material piles 200S has a convex dot shape. Also, the viscosity of the liquid resin material may be controlled by adding a filler.

Since subsequent processes are the same as the processes described above with reference to FIGS. 7A to 9B, detailed descriptions thereof are omitted here.

Figure 11A:
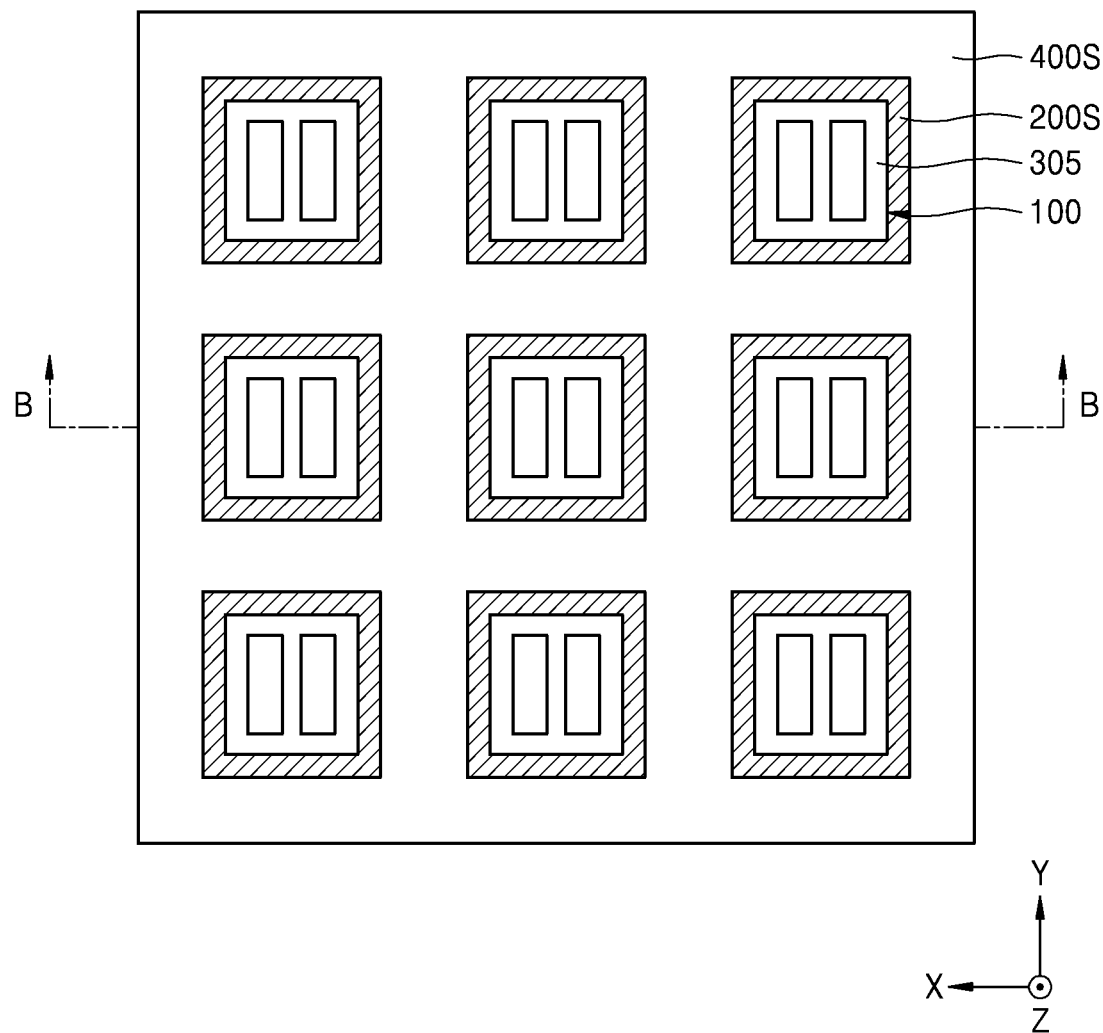
FIGS. 11A and 11B are diagrams of process operations of a method of manufacturing an LED package, according to an example embodiment.
Figure 11B:
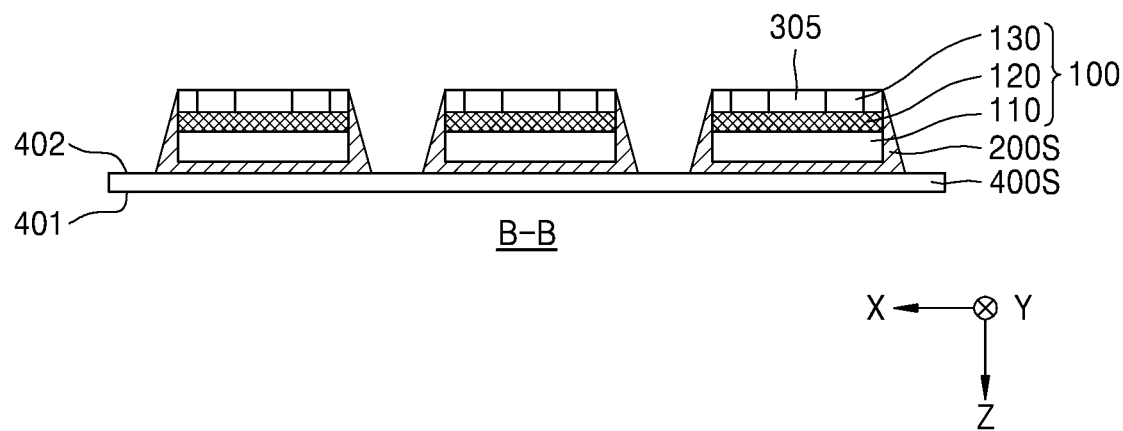

FIGS. 11A and 11B are diagrams of process operations of a method of manufacturing an LED package 20, according to an example embodiment.

Specifically, FIG. 11B is a cross-sectional view of a portion corresponding to a cross-section taken along a line B-B of FIG. 11A.

A method of manufacturing the LED package 20 described with reference to FIGS. 2A to 2C, according to an example embodiment, will be described with reference to FIGS. 11A and 11B.

Light-transmissive material piles 200S may be formed on a second surface 402 of a wavelength conversion film 400S, and LEDs 100 may be located such that a level of uppermost surfaces of the light-transmissive material piles 200S is at the same level as exposed surfaces of the electrode pads 130. In this case, side surfaces of the electrode pads 130 may be surrounded by an electrode coating layer 305 in the LEDs 100. The electrode coating layer 305 may not be formed during the formation of the coating layer (refer to 300 in FIG. 8B) but may be formed during the formation of the LEDs 100.

The above-described structure may be obtained using a manufacturing method by which forming the LEDs 100 having the electrode coating layer 305 is followed by locating the LEDs 100 on the light-transmissive material piles 200S. Since the light-transmissive material completely cover the side surfaces of the LEDs 100, light extraction efficiency of the LED package 20 may be effectively increased.

Since other processes are the same as the above-described processes of the method of manufacturing the LED package 10, detailed descriptions thereof are omitted here.

FIGS. 12A to 13B are diagrams of process operations of a method of manufacturing an LED package 30, according to an example embodiment.

Figure 12A:
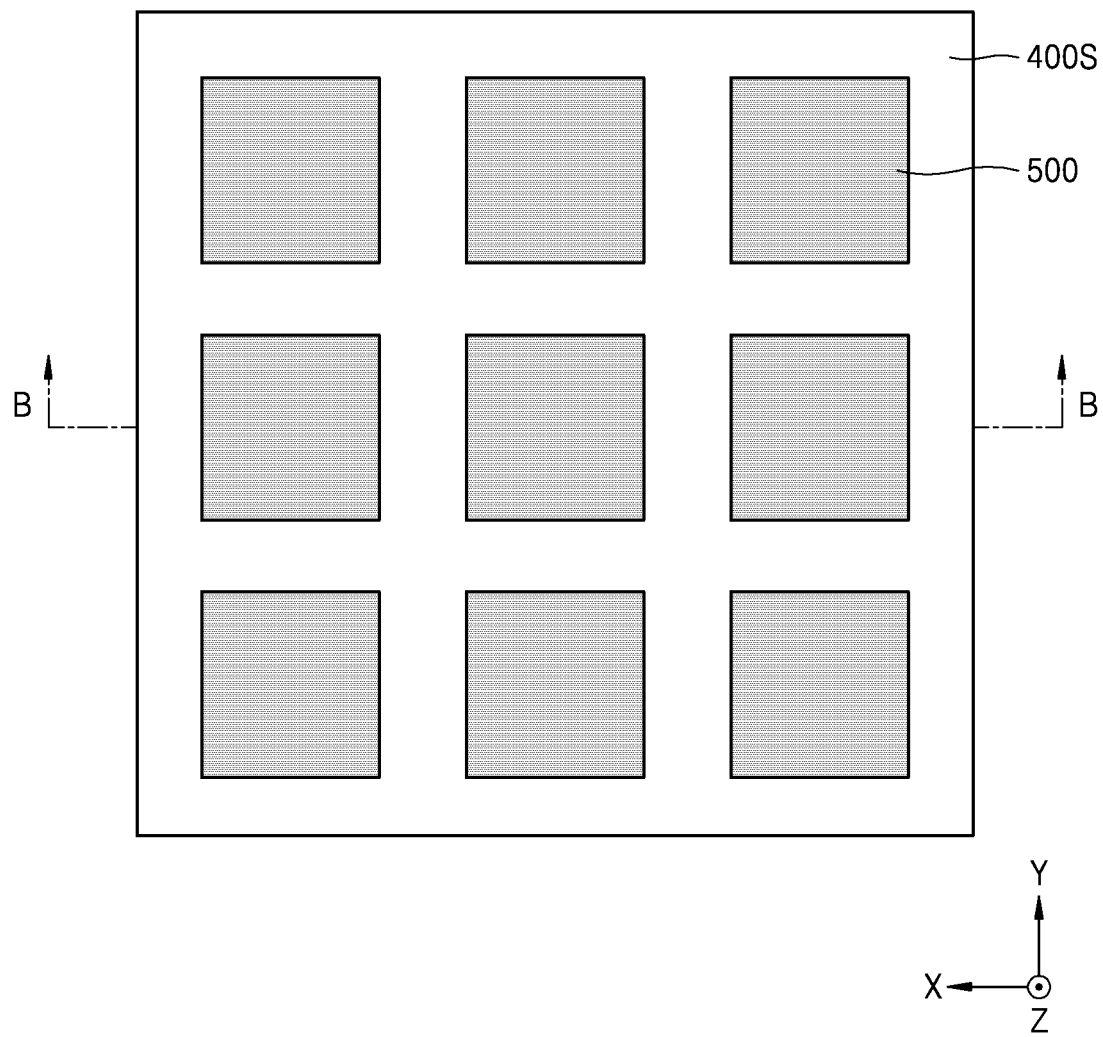
FIGS. 12A to 13B are diagrams of process operations of a method of manufacturing an LED package, according to an example embodiment.
Figure 12B:
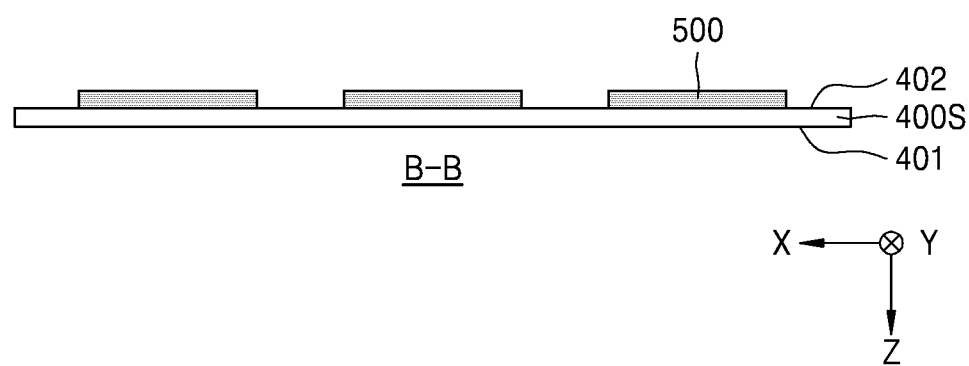
Figure 13A:
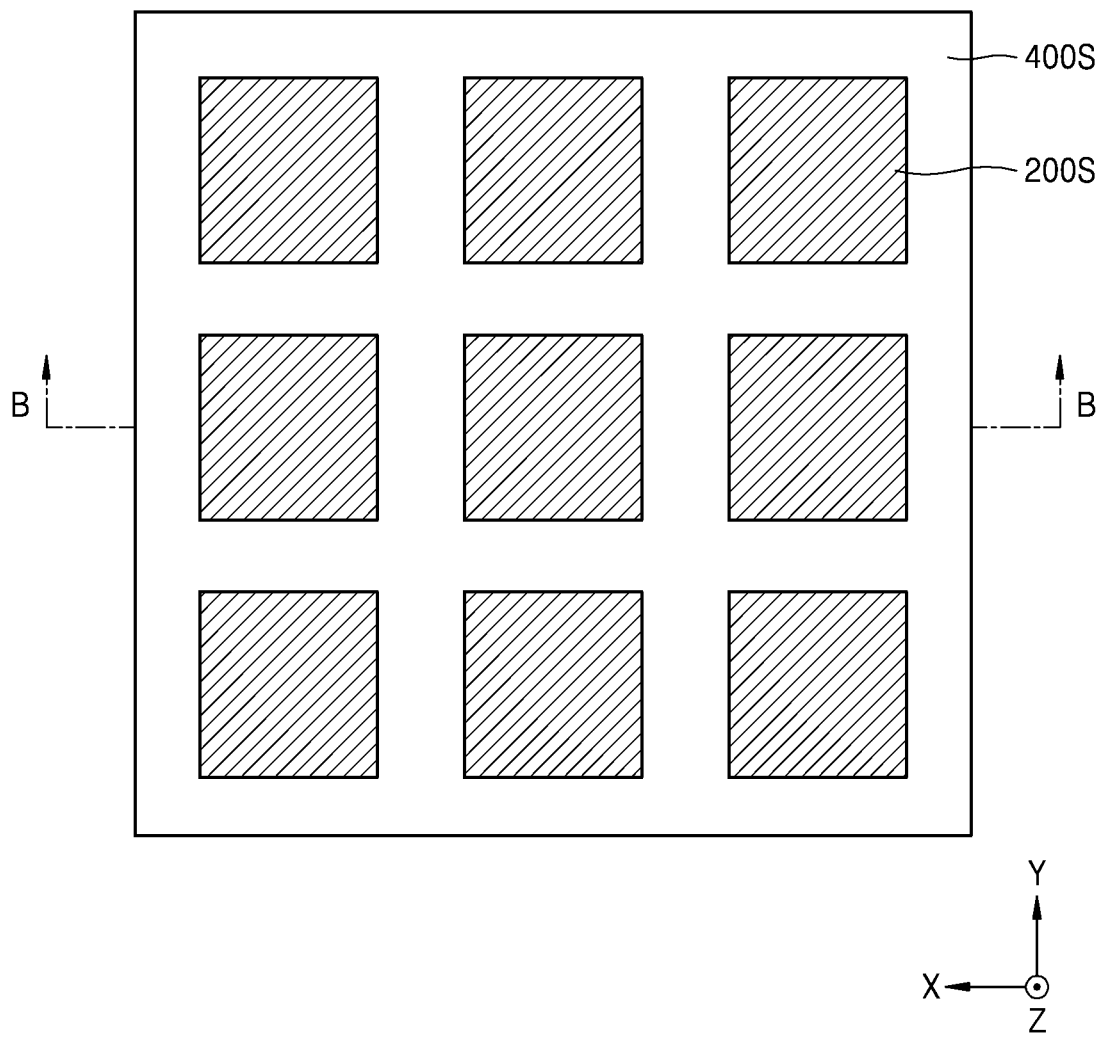
Figure 13B:
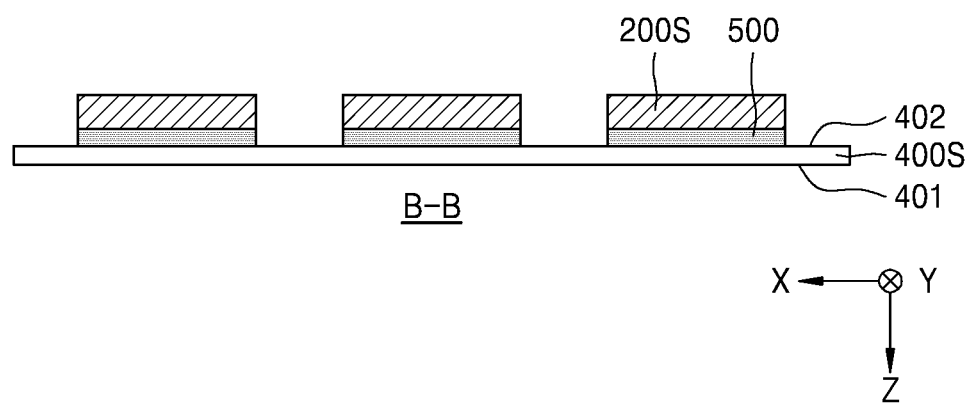

Specifically, FIGS. 12B and 13B are cross-sectional views of portions corresponding to cross-sections taken along lines B-B of FIGS. 12A and 13A, respectively. A method of manufacturing the LED package 30 described with reference to FIGS. 3A to 3C, according to an example embodiment, will be described with reference to FIGS. 12A to 13B.

Referring to FIGS. 12A and 12B, a plurality of interlayers 500 having planar rectangular shapes may be formed on a second surface 402 of a wavelength conversion film 400S. In this case, the interlayers 500 may be located on one wavelength conversion film 400S using a relatively large wavelength conversion film 400S. Also, when a distance between adjacent ones of the interlayers 500 is excessively large, the number of LED packages that may be formed simultaneously may be reduced, and mass production efficiency of the LED packages may be degraded. Thus, the interlayers 500 may be arranged at appropriate intervals. As described above, a refractive index of a material included in the interlayers 500 may be selected considering relationships with other layers.

Referring to FIGS. 13A and 13B, the interlayers 500 may be coated with light-transmissive material piles 200S. If the interlayers 500 are not present, a sectional shape of the light-transmissive material piles 200S may be determined by surface tension between a raw material included in the light-transmissive material piles 200S and the wavelength conversion film 400S. Concave light-transmission material piles 200S may be formed due to a difference in surface tension according to material. To overcome the above-described phenomenon, the interlayers 500 may serve as buffer layers configured to prevent the light-transmissive materials 200S from being formed in concave sectional shapes.

Since other processes are the same as the above-described processes of the method of manufacturing the LED package 10, detailed descriptions thereof are omitted here.

Figure 14A:
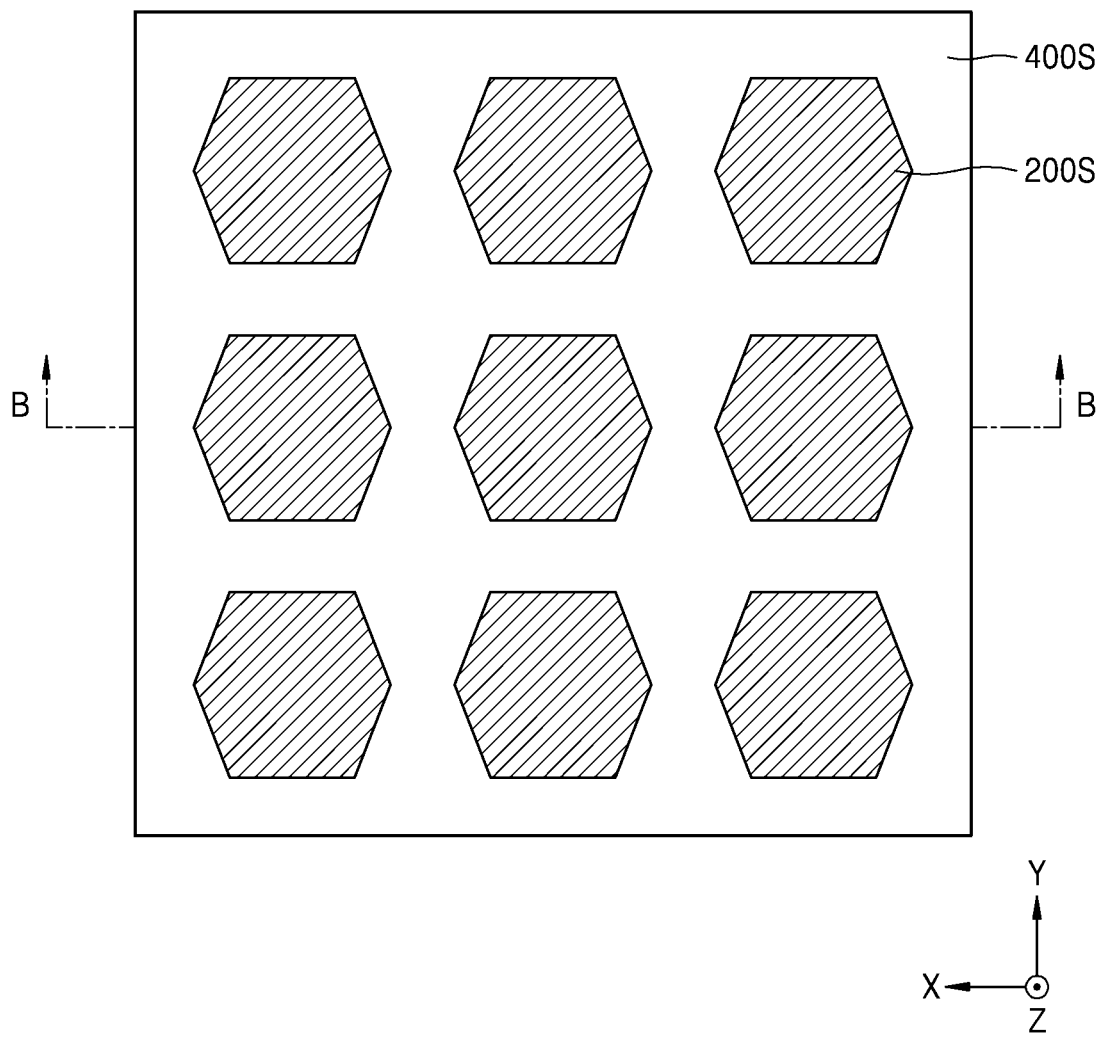
FIGS. 14A and 14B are diagrams of process operations of a method of manufacturing an LED package, according to an example embodiment.
Figure 14B:
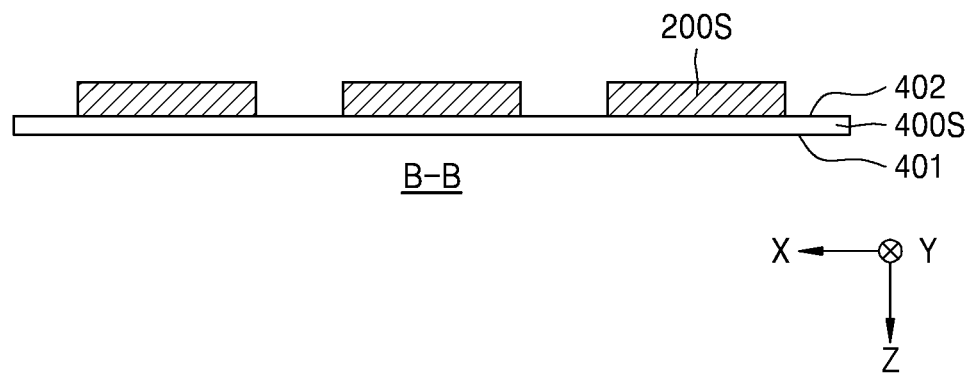

FIGS. 14A and 14B are diagrams of process operations of a method of manufacturing an LED package 40 according to an example embodiment.

Specifically, FIG. 14B is a cross-sectional view of a portion corresponding to a cross-section taken along a line B-B of FIG. 14A.

A method of manufacturing the LED package 40 described with reference to FIG. 4 will be described with reference to FIGS. 14A and 14B.

When viewed from above, light-transmissive material piles 200S may be formed in an N-angled shape (N is a natural number equal to or more than 4) on a second surface 402 of a wavelength conversion film 400S. Although FIG. 14A illustrates an example in which each of the light-transmissive material piles 200S has a hexagonal shape (N=6), the inventive concept is not limited thereto. The light-transmissive material piles 200S may be formed in a desired shape corresponding to the shape of the LED 100 and thus, light extraction efficiency of the LED package 40 may be effectively increased.

Since other processes are the same as the above-described processes of the method of manufacturing the LED package 10, detailed descriptions thereof are omitted here.

Figure 15:
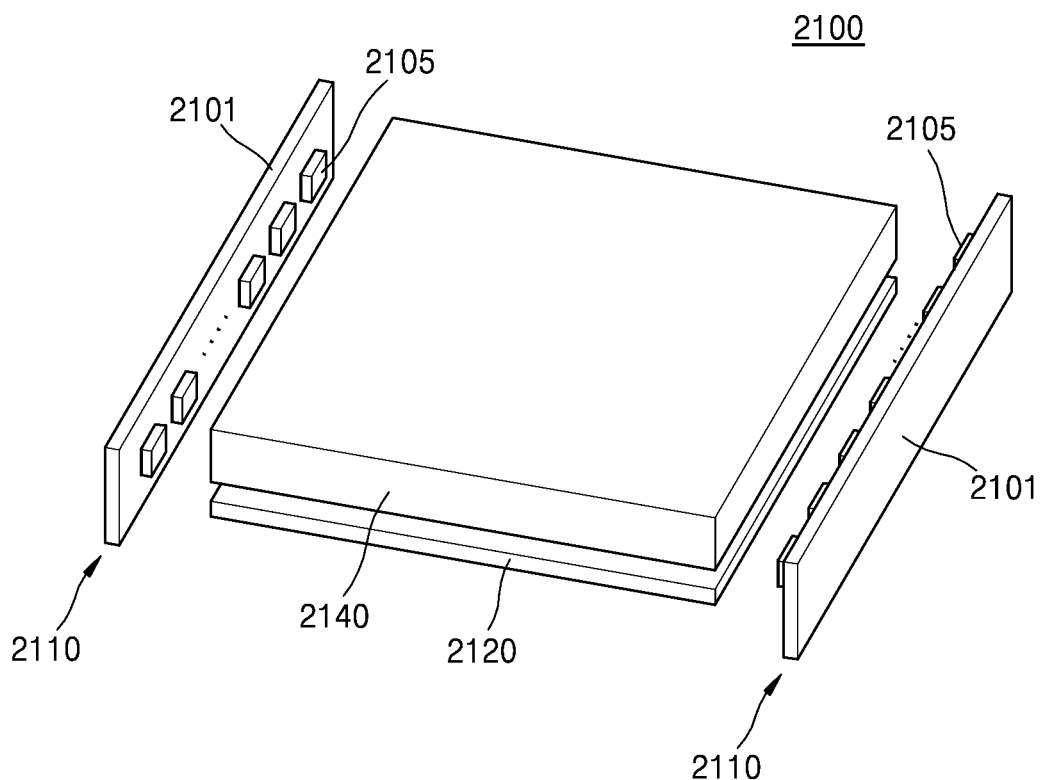
FIG. 15 is a schematic perspective view of a backlight unit (BLU) including an LED package, according to an example embodiment.

FIG. 15 is a schematic perspective view of a backlight unit (BLU) 2100 including an LED package according to an example embodiment.

Specifically, the BLU 2100 may include a light guide plate (LGP) 2140 and light source modules 2110 provided on both side surfaces of the LGP 2140. Also, the BLU 2100 may further include a reflection plate 2120 located under the LGP 2140. The BLU 2100 according to the present embodiment may be an edge-type BLU. In some embodiments, the light source module 2110 may be provided on only one side surface of the LGP 2140 or further provided on another side surface thereof. The light source module 2110 may include a printed circuit board (PCB) 2101 and a plurality of light sources 2105 mounted on a top surface of the PCB 2101. The light source 2105 may be any one of the LED packages 10 to 13, 20 to 22, 30, and 40, according to the above-described embodiments.

Figure 16:
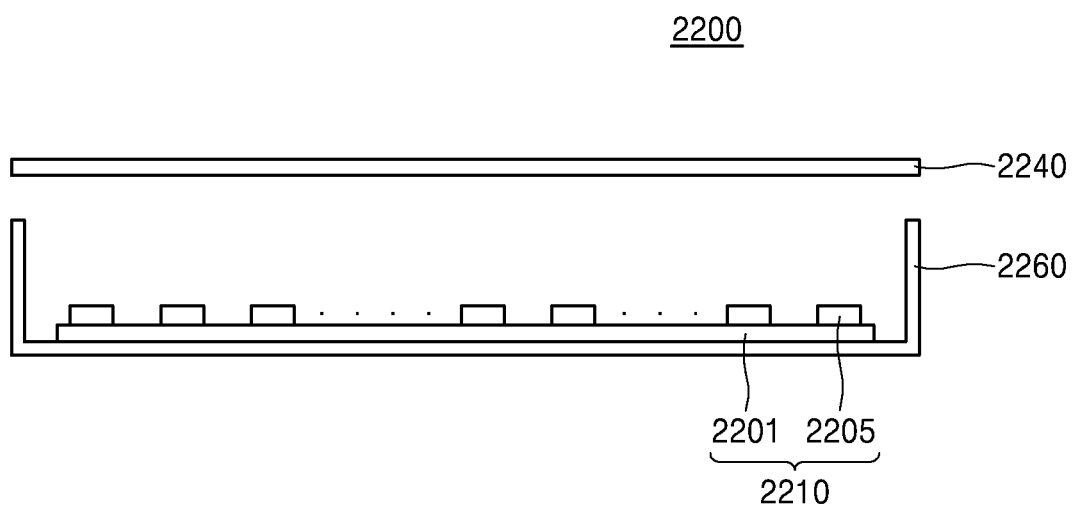
FIG. 16 is a diagram of a direct-light-type BLU including an LED package, according to an example embodiment.

FIG. 16 is a diagram of a BLU 2200 including an LED package according to an example embodiment.

Specifically, the BLU 2200 may include a light diffusion plate 2240 and a light source module 2210 arranged under the light diffusion plate 2240. Also, the BLU 2200 may further include a bottom case 2260, which may be located under the light diffusion plate 2240 and contain the light source module 2210. The BLU 2200 of the present embodiment may be a direct-light-type BLU.

The light source module 2210 may include a PCB 2201 and a plurality of light sources 2205 mounted on a top surface of the PCB 2201. Each of the light sources 2205 may be any one of the LED packages 10 to 13, 20 to 22, 30, and 40, according to the above-described embodiments.

Figure 17:
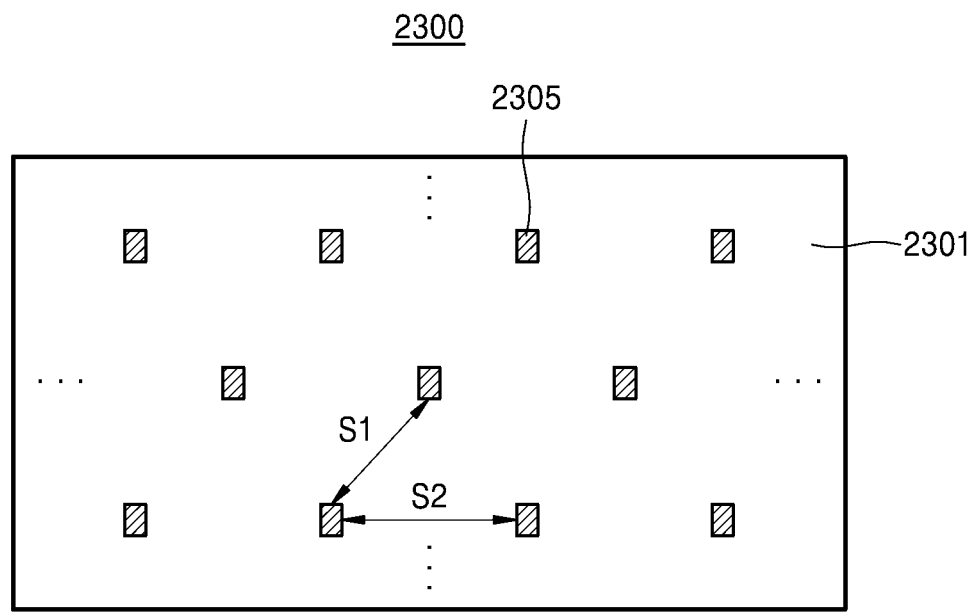
FIG. 17 is a diagram of a BLU including an LED package, according to an example embodiment.

FIG. 17 is a diagram of a BLU 2300 including an LED package according to an example embodiment.

Specifically, FIG. 17 illustrates an example of the arrangement of light sources 2305 in a direct-light-type BLU 2300. The light source 2305 may be any one of the LED packages 10 to 13, 20 to 22, 30, and 40, according to the above-described embodiments.

In some embodiments, the direct-light-type BLU 2300 may include a plurality of light sources 2305 arranged on a substrate 2301. An arrangement structure of the light sources 2305 may be a matrix structure in which each of rows and columns is formed in zigzag. That is, a first matrix may include a plurality of light sources 2305 arranged in rows and columns in straight lines, and a second matrix having the same shape as the first matrix may be located inside the first matrix. Thus, it may be understood that each of the light sources 2305 of the second matrix is located inside a square formed by four adjacent light sources 2305 included in the first matrix However, in the direct-light-type BLU 2300, when necessary, arrangement structures and intervals of the first and second matrices may be different from each other to improve luminance uniformity and light efficiency. In addition to a method of arranging the plurality of light sources 2305, distances 51 and S2 between adjacent light sources 2305 may be optimized to ensure luminance uniformity. As described above, when rows and columns of the light sources 2305 are not arranged in straight lines but arranged in zigzag, the number of light sources 2305 for the same emission area may be reduced by about 15% to about 25%.

Figure 18:
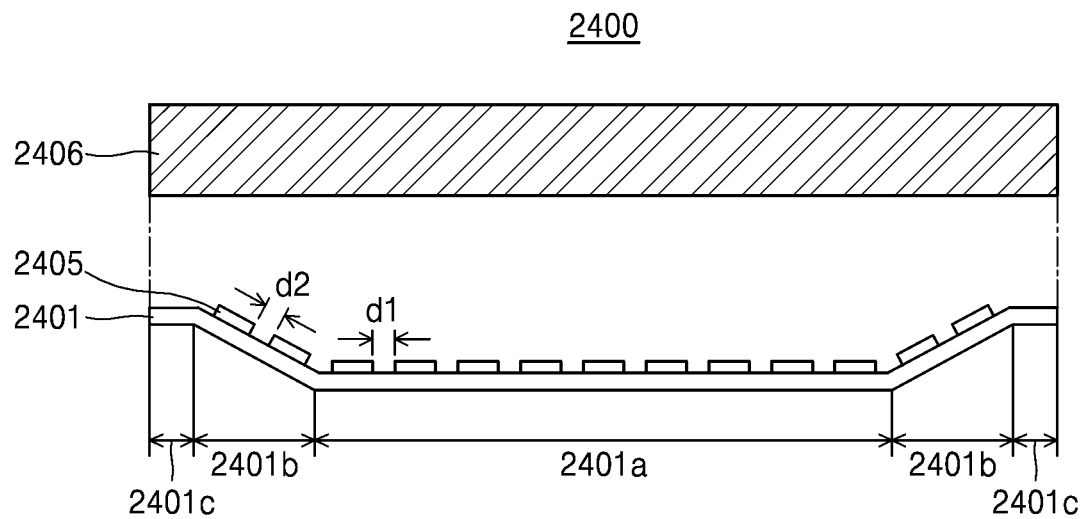
FIG. 18 is a diagram of a direct-light-type BLU including an LED package, according to an example embodiment.

FIG. 18 is a diagram of a direct-light-type BLU including an LED package according to an example embodiment.

Specifically, the direct-light-type BLU 2400 may include light sources 2405 mounted on a circuit board 2401 and at least one optical sheet 2406 located over the light sources 2405. The light sources 2405 may be white LEDs containing red phosphor. In some embodiments, the direct-light-type BLU 2400 may be a module in which the light sources 2405 are mounted on the circuit board 2401. Each of the light sources 2405 may be any one of the LED packages 10 to 13, 20 to 22, 30, and 40, according to the above-described embodiments.

The circuit board 2401 used in the present embodiment may have a first planar unit 2401a corresponding to a main region, inclined units 2401b, which may be located around the first planar unit 2401a and at least portions of which are bent, and second planar units 2401c located at corners of the circuit board 2401 outside the inclined units 2401b. The light sources 2405 may be arranged on the first planar unit 2401a and spaced a first distance d1 apart from each other. At least one light source 2405 may be arranged on the inclined units 2401b and spaced a second distance d2 apart from each other. The first distance d1 may be equal to the second distance d2. A width (or length in a section) of the inclined units 2401b may be less than a width of the first planar unit 2401a and greater than a width of the second planar units 2401c. Also, at least one light source 2405 may be arranged on the second planar units 2401c as needed.

An inclination of the inclined units 2401b may be appropriately controlled in a small range of between 0° and 90° with respect to the first planar unit 2401a. Since the circuit board 2401 has the above-described structure, even edge portions of the optical sheet 2406 may maintain uniform luminance.

Figure 19:
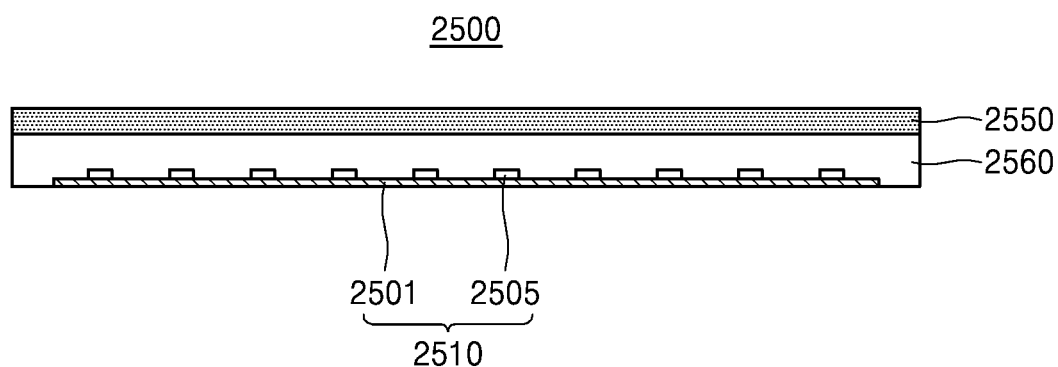
FIGS. 19 to 21 are diagrams of BLUs including LED packages, according to example embodiments.
Figure 20:
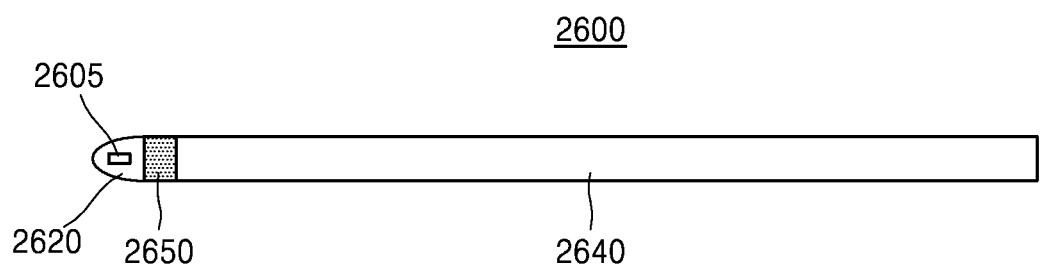
Figure 21:
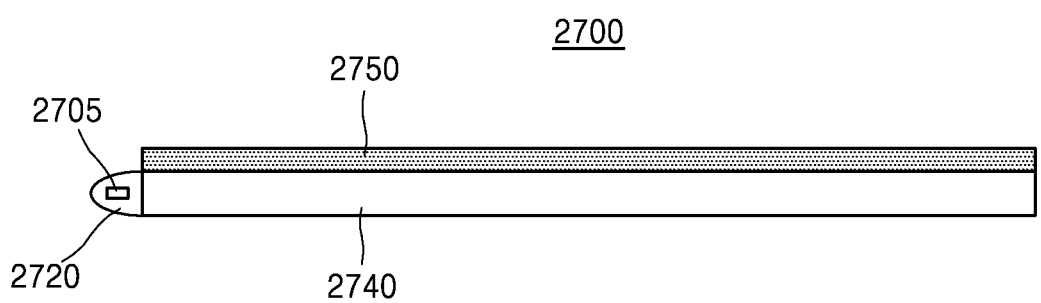

FIGS. 19 to 21 are diagrams of BLUs 2500, 2600, and 2700 including LED packages according to example embodiments.

Specifically, wavelength conversion units 2550, 2650, and 2750 may not be located in light sources 2505, 2605, and 2705 but may be located in the BLUs 2500, 2600, and 2700 outside the light sources 2505, 2605, and 2705 and convert light. Each of the light sources 2505, 2605, and 2705 may be any one of the LED packages 10 to 13, 20 to 22, 30, and 40, according to the above-described embodiments.

The BLU 2500 of FIG. 19, which is a direct-light-type BLU, may include a wavelength conversion unit 2550, a light source module 2510 arranged below the wavelength conversion unit 2550, and a bottom case 2560 configured to contain the light source module 2510. Also, the light source module 2510 may include a PCB 2501 and a plurality of light sources 2505 mounted on a top surface of the PCB 2501.

In the BLU 2500, a wavelength conversion unit 2550 may be located on the bottom case 2560. Accordingly, a wavelength of at least part of light emitted by the light source module 2510 may be converted by the wavelength conversion unit 2550. Although the wavelength conversion unit 2550 may be prepared as an additional film and applied, the wavelength conversion unit 2550 may be integrally combined with a light diffusion plate (not shown) and provided.

The BLUs 2600 and 2700 of FIGS. 20 and 21, which are edge-type BLUs, may include wavelength conversion units 2650 and 2750, LGPs 2640 and 2740, reflection units 2620 and 2720 located one of the sides of the LGPs 2640 and 2740, and light sources 2605 and 2705, respectively. Light emitted by the light sources 2605 and 2705 may be guided into the LGPs 2640 and 2740 by the reflection units 2620 and 2720, respectively. In the BLU 2600 of FIG. 20, the wavelength conversion unit 2650 may be located between the LGP 2640 and the light source 2605. In the BLU 2700 of FIG. 21, the wavelength conversion unit 2750 may be located on a light emission surface of the LGP 2740.

The wavelength conversion units 2550, 2650, and 2750 may include a typical phosphor. In particular, the wavelength conversion units 2550, 2650, and 2750 may use a quantum dot phosphor to make up for characteristics of quantum dots that are vulnerable to heat or moisture from light sources.

Figure 22:
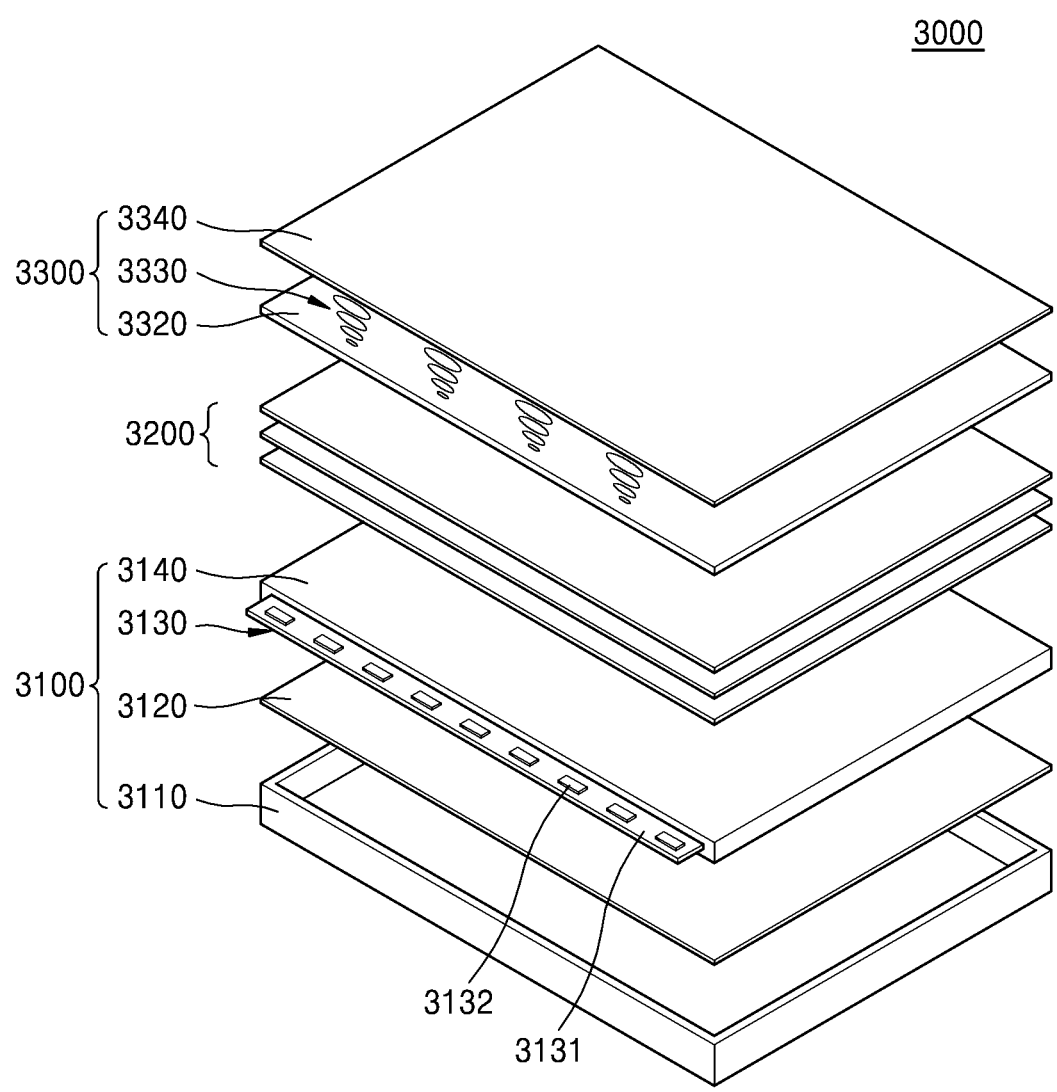
FIG. 22 is a schematic exploded perspective view of a display device including an LED package, according to an example embodiment.

FIG. 22 is a schematic exploded perspective view of a display device 3000 including an LED package according to an example embodiment.

Specifically, the display device 3000 may include a BLU 3100, an optical sheet 3200, and an image display panel (e.g., a liquid crystal (LC) panel) 3300. The BLU 3100 may include a bottom case 3110, a reflection plate 3120, an LGP 3140, and a light source module 3130 provided on at least one side surface of the LGP 3140. The light source module 3130 may include a PCB 3131 and light sources 3132.

In particular, the light sources 3132 may be side-view-type LEDs mounted on a side surface adjacent to a light emission surface. Each of the light sources 3132 may be any one of the LED packages 10 to 13, 20 to 22, 30, and 40, according to the above-described embodiments. Each of the light sources 3132 may include various types of sheets, such as a sheet, a prism sheet, or a protective sheet.

The image display panel 3300 may display images using light emitted by the optical sheet 3200. The image display panel 3300 may include an array substrate 3320, a liquid crystal (LC) layer 3330, and a color filter substrate 3340. The array substrate 3320 may include pixel electrodes arranged in a matrix shape, thin-film transistors (TFTs) configured to apply a driving voltage to the pixel electrode, and signal lines configured to operate the TFTs.

The color filter substrate 3340 may include a transparent substrate, a color filter, and a common electrode. The color filter may include filters configured to selectively pass light having a specific wavelength from among white light emitted by the BLU 3100. The LC layer 3330 may be rearranged due to an electric field formed between the pixel electrode and the common electrode to control a light transmittance. Light of which the light transmittance is controlled may be transmitted through the color filter of the color filter substrate 3340 and display images. The image display panel 3300 may further include a driver circuit unit configured to process image signals.

Since the display device 3000 of the present embodiment uses the light sources 3132 configured to emit blue, green, and red light having a relatively small full width at half-maximum (FWHM), after the emitted light passes through the color filter substrate 3340, blue, green, and red colors having high color purities may be realized.

Figure 23:
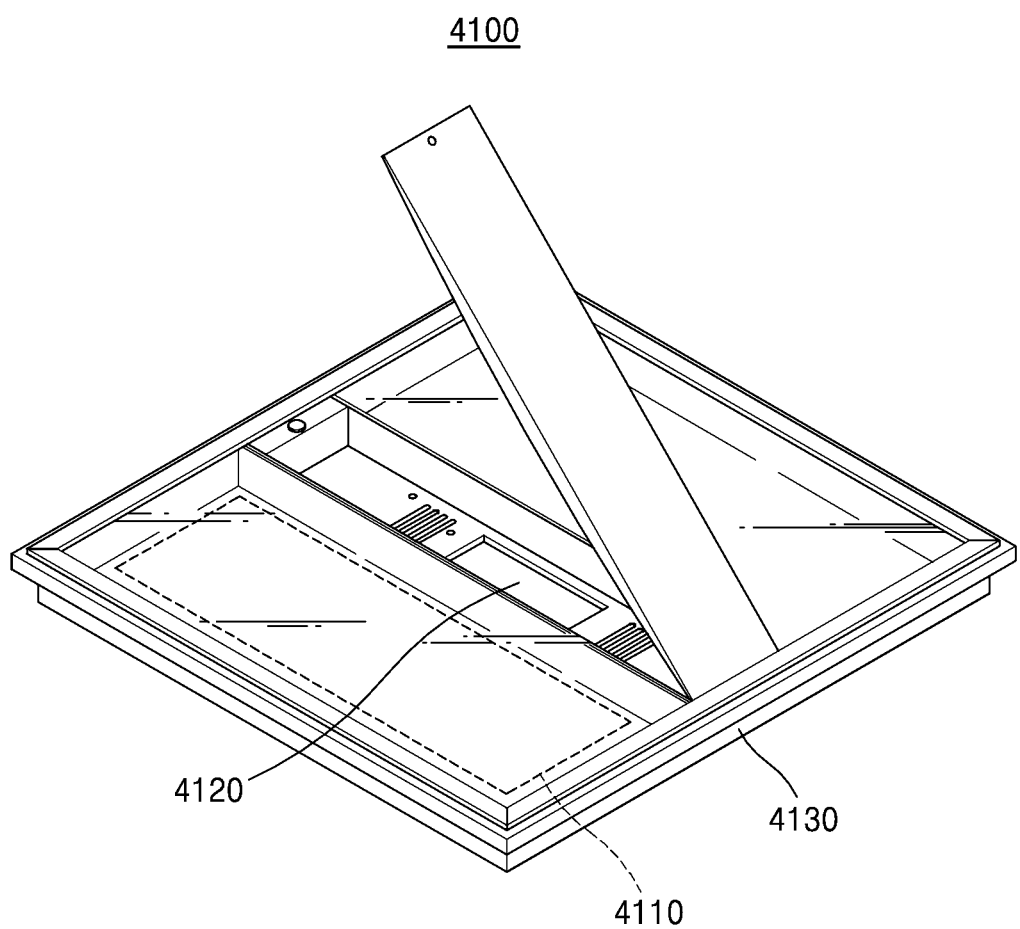
FIG. 23 is a schematic perspective view of a flat-panel lighting device including an LED package, according to an example embodiment.

FIG. 23 is a schematic perspective view of a flat-panel lighting device 4100 including an LED package according to an example embodiment.

Specifically, the flat-panel lighting device 4100 may include a light source module 4110, a power supply device 4120, and a housing 4130. The light source module 4110 may include an LED array as a light source. The light source module 4110 may include, as a light source, any one of the LED packages 10 to 13, 20 to 22, 30, and 40, according to the above-described embodiments. The power supply device 4120 may include an LED driver.

The light source module 4110 may include an LED array and form a generally planar shape. The LED array may include an LED and a controller configured to store driving information about the LED.

The power supply device 4120 may be configured to supply power to the light source module 4110. The housing 4130 may have a containing space to accommodate the light source module 4110 and power supply device 4120 therein. Although the housing 4130 has a hexahedral shape having an open side surface, the inventive concept is not limited thereto. The light source module 4110 may be located to emit light to the open side surface of the housing 4130.

Figure 24:
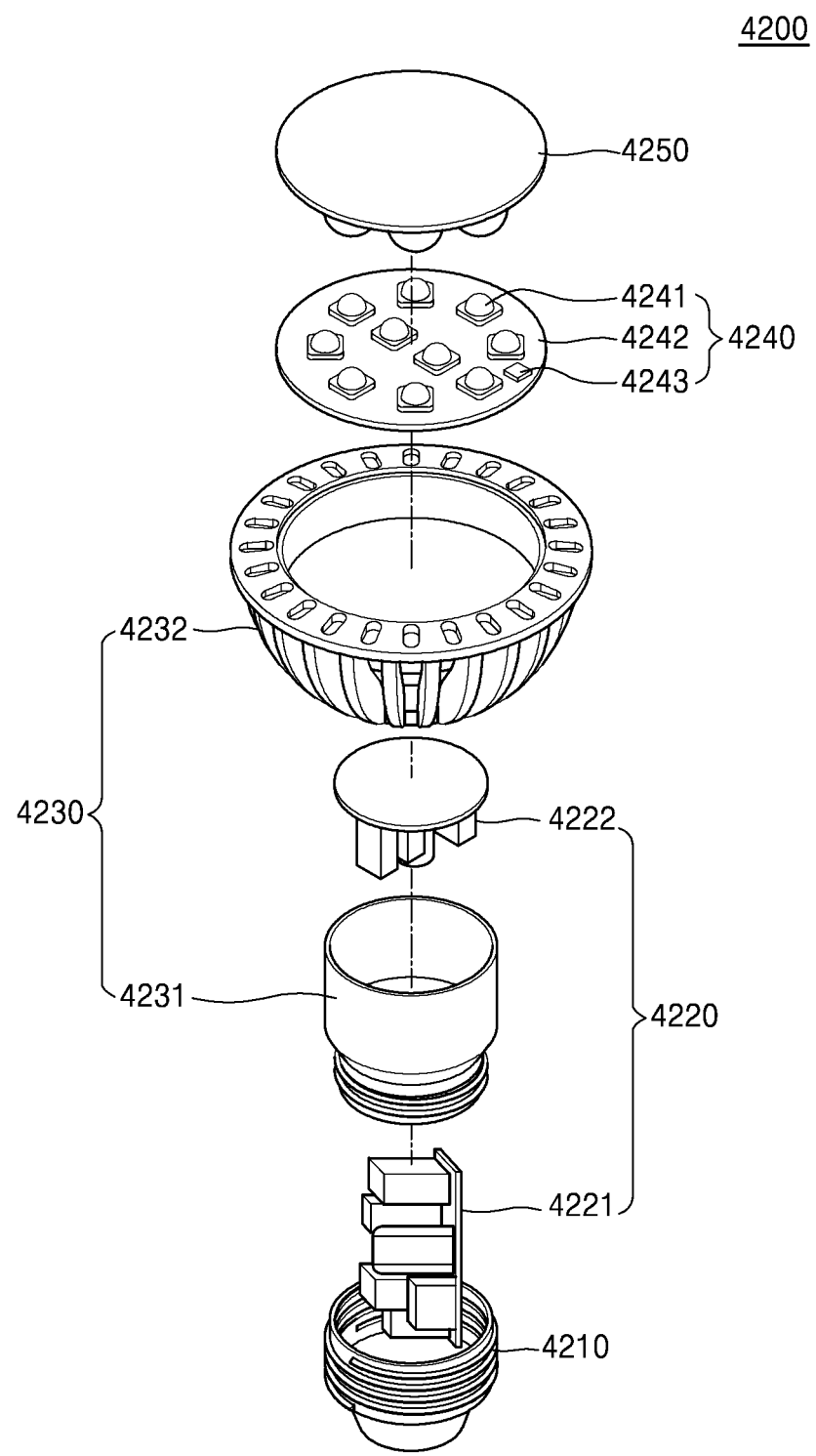
FIG. 24 is a schematic exploded perspective view of a lighting device including an LED package, according to an example embodiment.

FIG. 24 is a schematic exploded perspective view of a lighting device 4200 including an LED package according to an example embodiment.

Specifically, the lighting device 4200 may include a socket 4210, a power unit 4220, a heat-dissipation unit 4230, a light source module 4240, and an optical unit 4250. The light source module 4240 may include an LED array, and the power unit 4220 may include an LED driver.

The socket 4210 may be configured to be replaceable with a lighting device of the related art. Power may be applied to the lighting device 4200 through the socket 4210. As shown in FIG. 24, a first power unit 4221 and a second power unit 4222, which are separated from each other, may be assembled into the power unit 4220. The heat-dissipation unit 4230 may include an inner heat-dissipation unit 4231 and an outer heat-dissipation unit 4232. The inner heat-dissipation unit 4231 may be directly connected to the light source module 4240 and/or the power unit 4220 and transmit heat to the outer heat-dissipation unit 4232 through the light source module 4240 and/or the power unit 4220. The optical unit 4250 may include an inner optical unit (not shown) and an outer optical unit (not shown) and be configured to uniformly disperse light emitted by the light source module 4240.

The light source module 4240 may receive power from the power unit 4220 and emit light to the optical unit 4250. The light source module 4240 may include at least one LED package 4241, a circuit substrate 4242, and a controller 4243, and the controller 4243 may store driving information about the LED package 4241. The LED package 4241 may include any one of the LED packages 10 to 13, 20 to 22, 30, and 40, according to the above-described embodiments.

Figure 25:
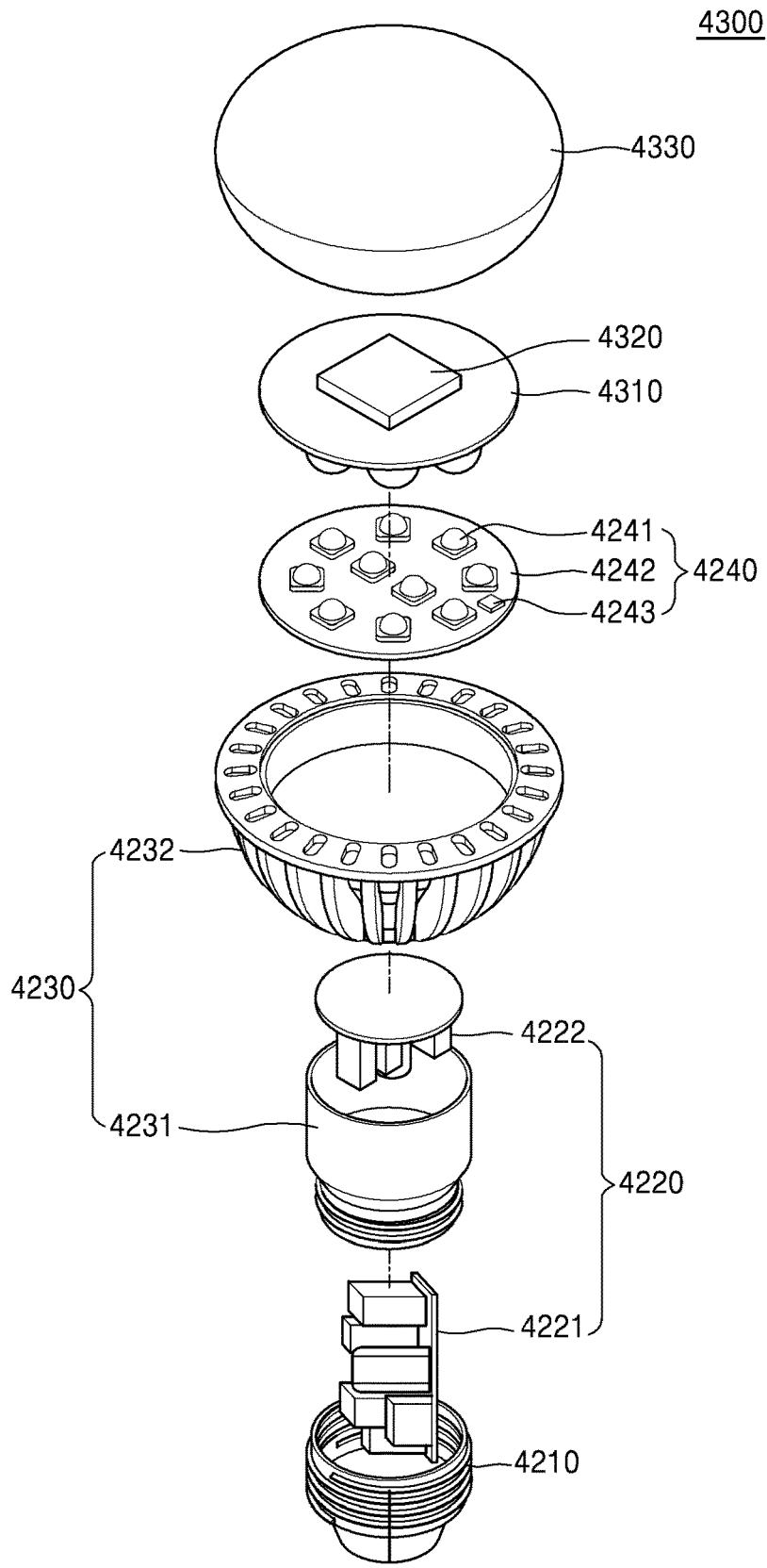
FIG. 25 is a schematic exploded perspective view of a lighting device including an LED package, according to an example embodiment.

FIG. 25 is a schematic exploded perspective view of a lighting device 4300 including an LED package according to an example embodiment.

Specifically, the lighting device 4300 according to the present embodiment may differ from the lighting device 4200 shown in FIG. 24 except that a reflection plate 4310 and a communication module 4320 are provided on a reflection plate 4310. The reflection plate 4310 may allow light from light sources to uniformly spread laterally and backwardly and reduce glare.

The communication module 4320 may be mounted on the reflection plate 4310, and a home-network communication may be realized through the communication module 4320. For example, the communication module 4320 may be a wireless communication module using Zigbee, WiFi, or LiFi. The communication module 4320 may control lighting devices installed inside and outside home (e.g., on/off and brightness control of lighting devices) using a smartphone or a wireless controller. Furthermore, a LiFi communication module using visible wavelengths of the lighting devices installed inside and outside the home may control electronic products and automotive systems at home and abroad, for example, TVs, refrigerators, air conditioners, door locks, and vehicles.

The reflection plate 4310 and the communication module 4320 may be covered by a cover unit 4330.

Figure 26:
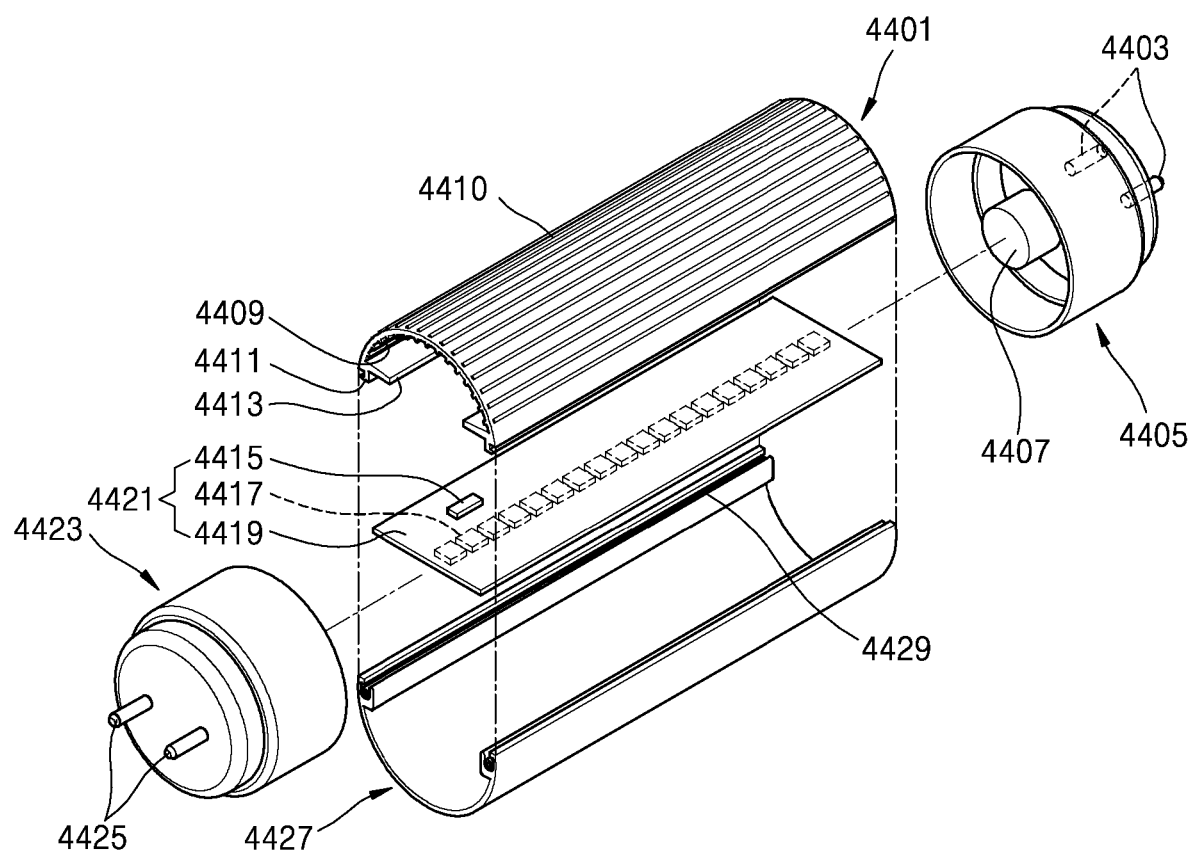
FIG. 26 is a schematic exploded perspective view of a bar-type lighting device including an LED package, according to an example embodiment.

FIG. 26 is a schematic exploded perspective view of a bar-type lighting device 4400 including an LED package according to an example embodiment.

Specifically, the bar-type lighting device 4400 may include a heat-dissipation member 4401, a cover 4427, a light source module 4421, a first socket 4405, and a second socket 4423. A plurality of heat-dissipation pins 4409 and 4410 may be formed in concave and convex shapes on an inner surface and/or outer surface of the heat-dissipation member 4401. The heat-dissipation pins 4409 and 4410 may be designed at various intervals to have various shapes. Supports 4413 may be formed in a protruding shape inside the heat-dissipation member 4401. The light source module 4421 may be fixed to the supports 4413. Clasps 4411 may be formed at both ends of the heat-dissipation member 4401.

Clasp grooves 4429 may be formed at the cover 4427. The clasps 4411 of the heat-dissipation member 4401 may be hook-coupled to the clasp grooves 4429. Positions of the clasp grooves 4429 and the clasps 4411 may be exchanged.

The light source module 4421 may include an LED array. The light source module 4421 may include a PCB 4419, light sources 4417, and a controller 4415. The controller 4415 may store driving information about the light sources 4417. Circuit interconnections configured to operate the light sources 4417 may be formed on the PCB 4419. Also, the light source module 4421 may include elements configured to operate the light source 4417. The light source 4417 may be any one of the LED packages 10 to 13, 20 to 22, 30, and 40, according to the above-described embodiments.

The first and second sockets 4405 and 4423, which are a pair of sockets, may be coupled to both ends of a cylindrical cover unit including the heat-dissipation member 4401 and the cover 4427. For example, the first socket 4405 may include electrode terminals 4403 and a power device 4407, and dummy terminals 4425 may be located at the second socket 4423. Also, an optical sensor and/or a communication module may be embedded in any one of the first socket 4405 or the second socket 4423. In some embodiments, an optical sensor and/or a communication module may be embedded in the second socket 4423 at which the dummy terminals 4425 are located. In other embodiments, an optical sensor and/or a communication module may be embedded at the first socket 4405 at which the electrode terminals 4403 are located.

While example embodiments of the inventive concept have been described with reference to the appended drawings, it will be understood by those of ordinary skill in the art that the inventive concept may be implemented in other specific forms without departing from the spirit and scope thereof as defined by the following claims. It should be understood that the above-described embodiments are not restrictive but illustrative in every respect.

What is claimed is:

1. A light-emitting diode (LED) package comprising:
   an LED having an upper surface, a lower surface, and side surfaces connecting the upper surface and the lower surface, and configured to generate and emit light, the LED having a polygonal shape in a plan view of the LED package;
   a light-transmissive layer covering the upper surface and at least some portions of the side surfaces of the LED, and configured to direct the light emitted from the LED in an upward direction;
   a wavelength conversion layer disposed on the light-transmissive layer, and configured to change a wavelength of the light emitted through the light-transmissive layer; and
   a coating layer covering side surfaces of the light-transmissive layer, and configured to reflect the light emitted through the light-transmissive layer in the upward direction at an interface with the light-transmissive layer,
   wherein, in a sectional view of the LED package, the side surfaces of the light-transmissive layer are inclined with respect to the side surfaces of the LED, and
   wherein, on a top surface of the light-transmissive layer, a length from a first point to a second point is greater than or equal to a length from the first point to a third point,
   wherein the first point is positioned vertically above a vertex of the LED in the plan view,
   wherein the second point is positioned at an end of a first virtual line on the top surface of the light-transmissive layer which overlaps a diagonal of a top surface of the LED and passes through the first point, the end of the first virtual line being the closest to the first point among both ends of the first virtual line, and
   wherein the third point is positioned at an end of a second virtual line on the top surface of the light-transmissive layer which overlaps a side of the top surface of the LED and passes through the first point, the end of the second virtual line being the closest to the first point among both ends of the second virtual line.

2. The LED package of claim 1, wherein, in the plan view of the LED package, the light-transmissive layer has a polygonal shape corresponding to the polygonal shape of the LED and having a greater size than the LED.

3. The LED package of claim 1, wherein the LED comprises a light emitting structure and a light-transmissive substrate having an interface fainted with the light-transmissive layer, and
wherein, the light-transmissive substrate comprises at least one of sapphire ($Al_2O_3$), gallium nitride (GaN), germanium (Ge), gallium arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAlO_2$), and magnesium aluminum oxide ($MgAl_2O_4$), and
wherein the light-transmissive layer comprises a silicon resin.

4. The LED package of claim 1, wherein the LED comprises a light emitting structure and a light-transmissive substrate having an interface fainted with the light-transmissive layer, and
wherein a refractive index of the light-transmissive substrate is greater than the light-transmissive layer.

5. The LED package of claim 1, wherein, in the plan view, a size of the light-transmissive layer is greater than a size of the LED, and
wherein a size of the wavelength conversion layer is greater than the size of the light-transmissive layer.

6. The LED package of claim 1, further comprising an interlayer as a buffer layer between the light-transmissive layer and the wavelength conversion layer,
wherein the interlayer has a refractive index greater than the wavelength conversion layer and lower than the light-transmissive layer.

7. The LED package of claim 1, wherein a thickness of the coating layer is greater than the light-transmissive layer.

8. The LED package of claim 7, wherein the thickness of the light-transmissive layer ranges 100 µm to 350 µm, and the thickness of the coating layer ranges 150 µm to 500 µm.

9. The LED package of claim 1, wherein the coating layer comprises at least one selected from the group consisting of $SiO_2$, $MgF_2$, SiN, $TiO_2$, and $Nb_2O_5$.

10. The LED package of claim 1, wherein side surfaces of the wavelength conversion layer and side surfaces of the coating layer are coplanar.

11. The LED package of claim 1, wherein the LED comprises a light emitting structure, a light-transmissive substrate disposed thereon, and an electrode pad,
wherein the light emitting structure comprises a first-conductive-type semiconductor layer, a second-conductive-type semiconductor layer, and an active layer interposed therebetween, and
wherein the light-transmissive layer covers entirety of the side surfaces of the light emitting structure and the light-transmissive substrate.

12. The LED package of claim 11, wherein the coating layer covers entirety of side surfaces of the light-transmissive layer forming the interface between the light-transmissive layer and the coating layer and at least some portions of side surfaces of the electrode pad.

13. The LED package of claim 12, further comprising an electrode coating layer covering at least some portions of side surfaces of the electrode pad,
wherein the light-transmissive layer covers at least some portions of side surfaces of the electrode coating layer.

14. A light-emitting diode (LED) package comprising:
an LED having an upper surface, a lower surface, and side surfaces connecting the upper surface and the lower surface, and configured to generate and emit light;
a light-transmissive layer covering the upper surface and the side surfaces of the LED, and configured to direct the light emitted from the LED in an upward direction;
a wavelength conversion layer disposed on the light-transmissive layer, and configured to change a wavelength of the light emitted through the light-transmissive layer; and
a coating layer covering the side surfaces of the light-transmissive layer, and configured to reflect the light emitted through the light-transmissive layer in the upward direction at an interface with the light-transmissive layer,
wherein, in a plan view of the LED package, the LED has a polygonal shape and the light-transmissive layer has a corresponding polygonal shape in the plan view, and
wherein, in a sectional view of the LED package, the side surfaces of the light-transmissive layer are inclined with respect to the side surfaces of the LED, and an angle formed by an edge connecting two adjacent side surfaces of the light-transmissive layer and a corresponding edge of the LED is greater than or equal to an angle formed by a side surface of the light-transmissive layer and a corresponding side surface of the LED.

15. The LED package of claim 14, wherein the LED comprises a light emitting structure and a light-transmissive substrate having an interface formed with the light-transmissive layer,
wherein the light-transmissive substrate comprises at least one of sapphire ($Al_2O_3$), gallium nitride (GaN), germanium (Ge), gallium arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAlO_2$), and magnesium aluminum oxide ($MgAl_2O_4$), and
wherein the light-transmissive layer comprises a silicon resin.

16. The LED package of claim 15, wherein the coating layer comprises at least one selected from the group consisting of $SiO_2$, $MgF_2$., SiN, $TiO_2$, and $Nb_2O_5$.

17. The LED package of claim 14, wherein the LED comprises a light emitting structure and a light-transmissive substrate having an interface formed with the light-transmissive layer, and
wherein a refractive index of the light-transmissive substrate is greater than the light-transmissive layer.

18. A light-emitting diode (LED) package comprising:
an LED having an upper surface, a lower surface, and side surfaces connecting the upper surface and the lower surface, and configured to generate and emit light;
a light-transmissive layer covering the upper surface and the side surfaces of the LED;
a wavelength conversion layer disposed on the light-transmissive layer, and configured to change a wavelength of the light emitted through the light-transmissive layer; and
a coating layer covering the side surfaces of the light-transmissive layer, and configured to reflect the light emitted through the light-transmissive layer in an upward direction,
wherein, in a plan view of the LED package, the LED has a polygonal shape and the light-transmissive layer has a corresponding polygonal shape,
wherein, on a top surface of the light-transmissive layer, a length from a first point to a second point is greater than or equal to a length from the first point to a third point, wherein the first point is positioned vertically above a vertex of the LED in the plan view, wherein the second point is positioned at an end of a first virtual line on the top surface of the light-transmissive layer which overlaps a diagonal of a top surface of the LED and passes through the first point, the end of the first virtual line being the closest to the first point among both ends of the first virtual line, wherein the third point is positioned at an end of a second virtual line on the top surface of the light-transmissive layer which overlaps a side of the top surface of the LED and passes through the first point, the end of the second virtual line being the closest to the first point among both ends of the second virtual line, and wherein, in a sectional view of the LED package, the side surfaces of the light-transmissive layer are inclined with respect to the side surfaces of the LED, and an angle formed by an edge connecting two adjacent side surfaces of the light-transmissive layer and a corresponding edge of the LED is greater than or equal to an angle formed by a side surface of the light-transmissive layer and a corresponding side surface of the LED.

19. The LED package of claim 18, wherein the LED comprises a light emitting structure, a light-transmissive substrate disposed thereon, and an electrode pad, wherein the light emitting structure comprises a first-conductive-type semiconductor layer, a second-conductive-type semiconductor layer, and an active layer interposed therebetween, and wherein the light-transmissive layer covers entirety of the side surfaces of the light emitting structure and the light-transmissive substrate.

20. The LED package of claim 18, wherein the coating layer covers entirety of side surfaces of the light-transmissive layer forming an interface between the light-transmissive layer and, the coating layer and at least some portions of side surfaces of the electrode pad.

* * * * *